(12) United States Patent
Umezaki

(10) Patent No.: US 10,608,015 B2
(45) Date of Patent: Mar. 31, 2020

(54) SEMICONDUCTOR DEVICE COMPRISING DRIVER CIRCUIT

(71) Applicant: Semiconductor Energy Laboratory Co., Ltd., Kanagawa-ken (JP)

(72) Inventor: Atsushi Umezaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 144 days.

(21) Appl. No.: 15/632,704

(22) Filed: Jun. 26, 2017

(65) Prior Publication Data

US 2017/0294458 A1    Oct. 12, 2017

Related U.S. Application Data

(63) Continuation of application No. 14/804,772, filed on Jul. 21, 2015, now abandoned.

(30) Foreign Application Priority Data

Jul. 24, 2014   (JP) .............................. 2014-150532

(51) Int. Cl.
| | | |
|---|---|---|
| *H01L 27/02* | (2006.01) | |
| *G11C 27/04* | (2006.01) | |
| *H01L 27/12* | (2006.01) | |
| *H01L 29/786* | (2006.01) | |
| *H01L 21/8226* | (2006.01) | |

(Continued)

(52) U.S. Cl.
CPC ........ *H01L 27/1225* (2013.01); *H01L 27/124* (2013.01); *H01L 29/7869* (2013.01); *G06F 3/041* (2013.01); *G09G 3/2092* (2013.01); *G09G 2310/0267* (2013.01); *G09G 2310/0286* (2013.01); *G09G 2310/08* (2013.01);

(Continued)

(58) Field of Classification Search
CPC ........ G09G 3/2092; G09G 2310/0267; G09G 2310/08; G09G 2310/0286; H01L 27/1225; H01L 29/7869; H01L 27/124; H01L 27/0207; H01L 21/8226; G06F 3/041; G11C 19/28; G11C 27/04

See application file for complete search history.

(56) References Cited

U.S. PATENT DOCUMENTS

| 5,949,271 A | 9/1999 | Fujikura |
|---|---|---|
| 6,621,886 B2 | 9/2003 | Kawahata |

(Continued)

FOREIGN PATENT DOCUMENTS

| EP | 2 840 566 A1 | 2/2015 |
|---|---|---|
| JP | 61-007724 A | 1/1986 |

(Continued)

*Primary Examiner* — M. A. Golub-Miller
(74) *Attorney, Agent, or Firm* — HuschBlackwell LLP

(57) ABSTRACT

The circuit includes a first transistor; a second transistor whose first terminal is connected to a gate of the first transistor for setting the potential of the gate of the first transistor to a level at which the first transistor is turned on; a third transistor for setting the potential of a gate of the second transistor to a level at which the second transistor is turned on and bringing the gate of the second transistor into a floating state; and a fourth transistor for setting the potential of the gate of the second transistor to a level at which the second transistor is turned off. With such a configuration, a potential difference between the gate and a source of the second transistor can be kept at a level higher than the threshold voltage of the second transistor, so that operation speed can be improved.

2 Claims, 26 Drawing Sheets

(51) Int. Cl.
G06F 3/041 (2006.01)
G09G 3/20 (2006.01)
G11C 19/28 (2006.01)

(52) U.S. Cl.
CPC .............. *G11C 19/28* (2013.01); *G11C 27/04* (2013.01); *H01L 21/8226* (2013.01); *H01L 27/0207* (2013.01)

(56) References Cited

U.S. PATENT DOCUMENTS

| | | | |
|---|---|---|---|
| 6,813,332 | B2 | 11/2004 | Nagao et al. |
| 6,928,136 | B2 | 8/2005 | Nagao et al. |
| 7,116,748 | B2 | 10/2006 | Nagao et al. |
| 7,151,278 | B2 | 12/2006 | Nagao et al. |
| 7,394,102 | B2 | 7/2008 | Nagao et al. |
| 7,486,269 | B2 | 2/2009 | Moon |
| 7,627,076 | B2 | 12/2009 | Tobita |
| 7,687,808 | B2 | 3/2010 | Umezaki |
| 7,932,888 | B2 | 4/2011 | Miyake |
| 7,964,876 | B2 | 6/2011 | Umezaki |
| 8,508,457 | B2 | 8/2013 | Kretz et al. |
| 8,508,459 | B2 | 8/2013 | Miyake |
| 8,531,376 | B2 | 9/2013 | Shimoda |
| 8,542,178 | B2 | 9/2013 | Yoo et al. |
| 8,598,591 | B2 | 12/2013 | Umezaki |
| 8,742,811 | B2 | 6/2014 | Umezaki |
| 8,766,901 | B2 | 7/2014 | Miyake |
| 8,798,226 | B2 | 8/2014 | Nagao et al. |
| 9,024,930 | B2 | 5/2015 | Nagao et al. |
| 9,058,889 | B2 | 6/2015 | Miyake |
| 9,064,753 | B2 | 6/2015 | Miyake |
| 9,153,341 | B2 | 10/2015 | Umezaki |
| 9,223,161 | B2 | 12/2015 | Ogasawara et al. |
| 9,245,891 | B2 | 1/2016 | Umezaki |
| 9,406,699 | B2 | 8/2016 | Umezaki |
| 9,583,513 | B2 | 2/2017 | Umezaki |
| 9,590,632 | B2 | 3/2017 | Nagao et al. |
| 9,646,714 | B2 | 5/2017 | Umezaki |
| 10,062,716 | B2 | 8/2018 | Umezaki |
| 10,068,543 | B2 | 9/2018 | Yamamoto et al. |
| 10,134,775 | B2 | 11/2018 | Umezaki |
| 2006/0280279 | A1 | 12/2006 | Nagao et al. |
| 2007/0274433 | A1 | 11/2007 | Tobita |
| 2008/0226013 | A1 | 9/2008 | Deane |
| 2009/0224245 | A1 | 9/2009 | Umezaki |
| 2010/0188385 | A1 | 7/2010 | Boiko |
| 2014/0023173 | A1 | 1/2014 | Miyake |
| 2017/0033125 | A1 | 2/2017 | Umezaki |
| 2017/0309345 | A1 | 10/2017 | Umezaki |

FOREIGN PATENT DOCUMENTS

| | | |
|---|---|---|
| JP | 10-112645 A | 4/1998 |
| JP | 2002-133890 A | 5/2002 |
| JP | 2002-175695 A | 6/2002 |
| JP | 2003-101394 A | 4/2003 |
| JP | 2004-226429 A | 8/2004 |
| JP | 2005-050502 A | 2/2005 |
| JP | 2006-351165 A | 12/2006 |
| JP | 2007-207413 A | 8/2007 |
| JP | 2007-257813 A | 10/2007 |
| JP | 2007-317288 A | 12/2007 |
| JP | 2008-089874 A | 4/2008 |
| JP | 2008-122939 A | 5/2008 |
| JP | 2008-537275 | 9/2008 |
| JP | 2010-108567 A | 5/2010 |
| JP | 2010-534380 | 11/2010 |
| JP | 2010-538407 | 12/2010 |
| JP | 2011-253169 A | 12/2011 |
| JP | 2012-075049 A | 4/2012 |
| JP | 2014-029758 A | 2/2014 |
| JP | 2014-039247 A | 2/2014 |
| WO | WO 2002/045091 A1 | 6/2002 |
| WO | WO 2006/100636 A2 | 9/2006 |
| WO | WO 2007/080813 A1 | 7/2007 |
| WO | WO 2009/013697 A1 | 1/2009 |
| WO | WO 2013/157285 A1 | 10/2013 |
| WO | WO 2014/208123 A1 | 12/2014 |

SEMICONDUCTOR DEVICE COMPRISING DRIVER CIRCUIT

This application is a continuation of copending U.S. application Ser. No. 14/804,772, filed on Jul. 21, 2015 which is incorporated herein by reference.

BACKGROUND OF THE INVENTION

1. Field of the Invention

One embodiment of the present invention relates to a semiconductor device, a display module, and an electronic appliance.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, a manufacture, or a composition of matter. Another embodiment of the present invention relates to a semiconductor device, a display device, a light-emitting device, a power storage device, a memory device, or a driving method or manufacturing method thereof.

2. Description of the Related Art

A circuit which can be applied to a driver circuit of a memory device, an image sensor, a display device, or the like has been developed. In particular, a circuit forming using transistors having the same polarity has been actively developed. A technique relating to such a circuit is disclosed in Patent Document 1.

In Patent Document 1, a potential difference between a gate and a source of a transistor is decreased gradually. When the potential difference between the gate and the source of the transistor is equal to or lower than the threshold voltage of the transistor, the transistor is turned off, and a node in a circuit is brought into a floating state.

REFERENCE

Patent Document

[Patent Document 1] Japanese Published Patent Application No. 2005-050502

SUMMARY OF THE INVENTION

In a conventional circuit, a potential difference between a gate and a source of a transistor is decreased gradually, and thus the drain current of the transistor is also decreased gradually. Therefore, the time required for change in a potential of a node in a circuit is long, and thus high-speed operation is difficult. Furthermore, W/L of the transistor needs to be increased, which makes it difficult to reduce a layout area. In addition, it is difficult to shorten the rise time and the fall time of a signal.

An object of one embodiment of the present invention is to provide a novel semiconductor device. Another object of one embodiment of the present invention is to provide high-speed operation or to provide a configuration which enables it. Another object of one embodiment of the present invention is to reduce a layout area or to provide a configuration which enables it. Another object of one embodiment of the present invention is to reduce a driving voltage or to provide a configuration which enables it. Another object of one embodiment of the present invention is to shorten the rise time and the fall time of a signal or to provide a configuration which enables it.

One embodiment of the present invention does not necessarily achieve all the objects listed above and only needs to achieve at least one of the objects. The description of the above objects does not disturb the existence of other objects. Other objects will be apparent from and can be derived from the description of the specification, the drawings, the claims, and the like.

One embodiment of the present invention is a semiconductor device including a first transistor, a second transistor, a third transistor, and a fourth transistor. One of a source and a drain of the first transistor is electrically connected to a first wiring, the other of the source and the drain of the first transistor is electrically connected to a second wiring, one of a source and a drain of the second transistor is electrically connected to a third wiring, the other of the source and the drain of the second transistor is electrically connected to a gate of the first transistor, one of a source and a drain of the third transistor is electrically connected to a fourth wiring, the other of the source and the drain of the third transistor is electrically connected to a gate of the second transistor, one of a source and a drain of the fourth transistor is electrically connected to a fifth wiring, and the other of the source and the drain of the fourth transistor is electrically connected to the gate of the second transistor.

One embodiment of the present invention is a semiconductor device including a first transistor, a second transistor, a third transistor, and a fourth transistor. One of a source and a drain of the first transistor is electrically connected to a first wiring, the other of the source and the drain of the first transistor is electrically connected to a second wiring, one of a source and a drain of the second transistor is electrically connected to a third wiring, the other of the source and the drain of the second transistor is electrically connected to a gate of the first transistor, one of a source and a drain of the third transistor is electrically connected to the third wiring, the other of the source and the drain of the third transistor is electrically connected to a gate of the second transistor, one of a source and a drain of the fourth transistor is electrically connected to a fourth wiring, and the other of the source and the drain of the fourth transistor is electrically connected to the gate of the second transistor.

One embodiment of the present invention is a semiconductor device including a first transistor, a second transistor, a third transistor, and a fourth transistor. One of a source and a drain of the first transistor is electrically connected to a first wiring, the other of the source and the drain of the first transistor is electrically connected to a second wiring, one of a source and a drain of the second transistor is electrically connected to a third wiring, the other of the source and the drain of the second transistor is electrically connected to a gate of the first transistor, one of a source and a drain of the third transistor is electrically connected to a fourth wiring, the other of the source and the drain of the third transistor is electrically connected to a gate of the second transistor, one of a source and a drain of the fourth transistor is electrically connected to the third wiring or the fourth wiring, and the other of the source and the drain of the fourth transistor is electrically connected to the gate of the second transistor.

Note that in one embodiment of the present invention, a gate of the fourth transistor may be connected to the first wiring or the second wiring.

One embodiment of the present invention is a display module including the above semiconductor device and an FPC.

Another embodiment of the present invention is an electronic appliance including the above display module, and, an antenna, an operation button, or a speaker.

One embodiment of the present invention can provide a novel semiconductor device. One embodiment of the present invention can provide high-speed operation or a configuration which enables it. One embodiment of the present invention can reduce a layout area or provide a configuration which enables it. One embodiment of the present invention can reduce a driving voltage or provide a configuration which enables it. One embodiment of the present invention can shorten the rise time and the fall time of a signal or provide a configuration which enables it.

Note that the description of these effects does not disturb the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1:
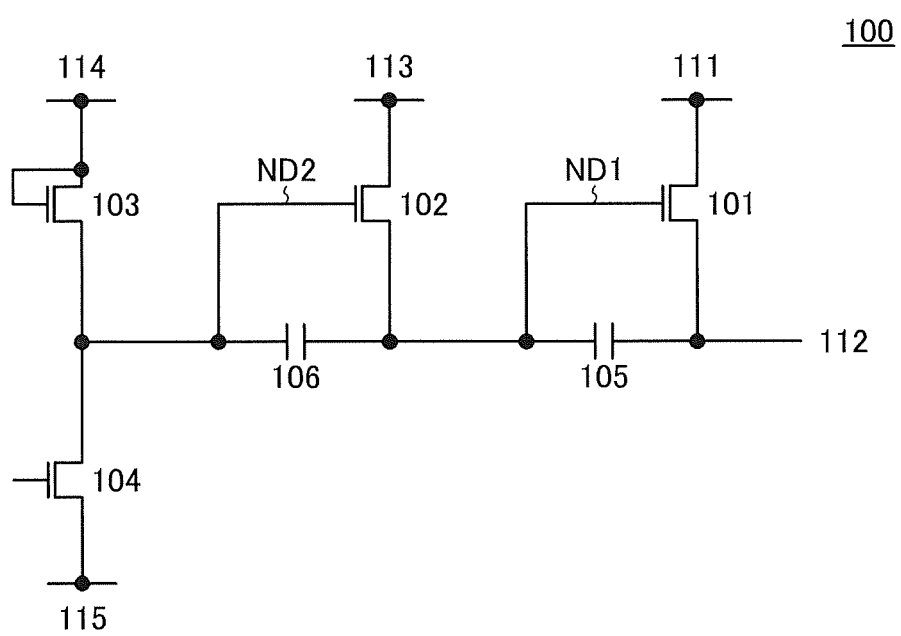
FIG. 1 illustrates an example of a semiconductor device.

Hereinafter, embodiments of the present invention will be described below in detail with reference to the accompanying drawings. Note that the present invention is not limited to the following description and it is easily understood by those skilled in the art that the mode and details can be variously changed without departing from the scope and spirit of the present invention. Therefore, the present invention should not be interpreted as being limited to the description of embodiments below.

One embodiment of the present invention includes, in its category, devices such as an imaging device, a radio frequency (RF) tag, a display device, and an integrated circuit. The display device includes, in its category, a display device including an integrated circuit, such as a liquid crystal display device, a light-emitting device in which a light-emitting element typified by an organic light-emitting element is provided in each pixel, an electronic paper, a digital micromirror device (DMD), a plasma display panel (PDP), and a field emission display (FED).

In describing structures of the present invention with reference to the drawings, the same reference numerals are used in common for the same portions in different drawings in some cases.

Note that in this specification and the like, part of a diagram or a text described in one embodiment can be taken out to constitute one embodiment of the invention. Thus, in the case where a diagram or a text related to a certain portion is described, the context taken out from part of the diagram or the text is also disclosed as one embodiment of the invention, and one embodiment of the invention can be constituted. The embodiment of the present invention is clear. Therefore, for example, in a diagram or text in which one or more active elements (e.g., transistors), wirings, passive elements (e.g., capacitors), conductive layers, insulating layers, semiconductor layers, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (or may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

In addition, contents that are not specified in any text or drawing in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

In this specification and the like, it might be possible for those skilled in the art to constitute one embodiment of the invention even when portions to which all the terminals of an active element (e.g., a transistor), a passive element (e.g., a capacitor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Thus, it might be possible to constitute one embodiment of the invention by specifying only portions to which some of terminals of an active element (e.g., a transistor), a passive element (e.g., a capacitor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

In this specification and the like, when it is explicitly described that X and Y are connected, the case where X and Y are electrically connected, the case where X and Y are functionally connected, and the case where X and Y are directly connected are included therein. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that enables an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path" Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a semiconductor device of one embodiment of the present invention will be described.

A structure of a semiconductor device of one embodiment of the present invention will be described with reference to FIG. 1. Note that one embodiment of the present invention is not limited to the structure described below.

A semiconductor device illustrated in FIG. 1 includes a circuit 100. The circuit 100 has a function of controlling the potential of a wiring 112 based on the potentials of a wiring 111, a wiring 113, a wiring 114, and a wiring 115. The circuit 100 outputs a signal based on the potentials of the wiring 111, the wiring 113, the wiring 114, and the wiring 115 to the wiring 112. The potential of the wiring 112 is controlled by the signal. As described above, the circuit 100 serves as a logic circuit or a sequential circuit.

The circuit 100 includes a transistor 101, a transistor 102, a transistor 103, a transistor 104, a capacitor 105, and a capacitor 106. A first terminal (also referred to as one of a source and a drain) of the transistor 101 is connected to the wiring 111, and a second terminal (also referred to as the other of the source and the drain) of the transistor 101 is connected to the wiring 112. A first terminal and a second terminal of the transistor 102 are connected to the wiring 113 and a gate of the transistor 101, respectively. A first terminal, a second terminal, and a gate of the transistor 103 are connected to the wiring 114, a gate of the transistor 102, and the wiring 114, respectively. A first terminal and a second terminal of the transistor 104 are connected to the wiring 115 and the gate of the transistor 102, respectively. A first terminal and a second terminal of the capacitor 105 are connected to the wiring 112 and the gate of the transistor 101, respectively. A first terminal and a second terminal of the capacitor 106 are connected to the gate of the transistor 101 and the gate of the transistor 102, respectively.

The semiconductor device in this embodiment has a connection relation described above, and thus can have a novel configuration.

Note that the gate of the transistor 101, the second terminal of the transistor 102, the second terminal of the capacitor 105, or a first terminal of the capacitor 106 is denoted by a node ND1. In addition, the gate of the transistor 102, a second terminal of the transistor 103, the second terminal of the transistor 104, or the second terminal of the capacitor 106 is denoted by a node ND2.

Note that the potentials of the wirings 111, 113, 114, and 115 are controlled in such a manner that a signal, voltage, or the like is input to the wirings. The potentials of the wirings 111, 113, and 114 each have a high level and a low level for convenience. That is, signals each having a high level and a low level are input to each of the wirings 111, 113, and 114. A high-level potential is VH, and a low-level potential is VL (VH>VL). The potential of the wiring 115 is VL. Note that the potential of the wiring 115 may have a high level and a low level. That is, a signal having a high level and a low level may be input to the wiring 115.

Note that the wirings 111, 113, and 114 may each be referred to as an input terminal. The wiring 112 may be referred to as an output terminal. The wirings 111, 112, 113, and 114 may each be referred to as a signal line. The wiring 115 may be referred to as a power supply line.

Transistors which can be used as the transistors 101, 102, 103, and 104 are described. Note that one embodiment of the present invention is not limited to the transistors described below.

As the transistors 101, 102, 103, and 104, a transistor including amorphous silicon in a channel formation region, a transistor including polycrystalline silicon in a channel formation region, a transistor including single crystal silicon in a channel formation region, a transistor including an oxide semiconductor in a channel formation region, a transistor including a compound semiconductor in a channel formation region, and the like can be used. In particular, a transistor including an oxide semiconductor in a channel formation region (also referred to as an OS transistor) has a higher mobility and an extremely lower off-state current than a transistor including amorphous silicon in a channel formation region. Accordingly, the channel width of the transistor can be made small, leading to a reduction in a layout area.

The conductivity type or the polarity of the transistors 101, 102, 103, and 104 is described. Note that one embodiment of the present invention is not limited to the conductivity type or the polarity described below.

The transistors 101, 102, 103, and 104 preferably have the same conductivity type. Alternatively, all the transistors included in the circuit 100 preferably have the same conductivity type. Further alternatively, all the transistors provided over the same substrate as the circuit 100 preferably have the same conductivity type. Thus, simplification of a manufacturing process, improvement in yield, reduction in manufacturing cost, or the like can be achieved.

Figure 26:
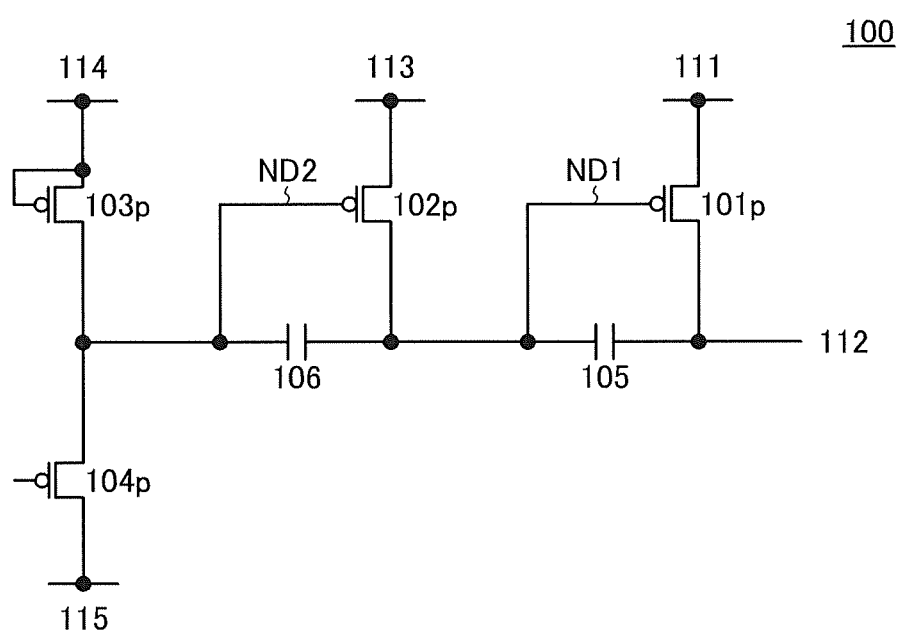
FIG. 26 illustrates an example of a semiconductor device.

It is particularly preferable that the transistors 101, 102, 103, and 104 be n-channel transistors. Alternatively, it is preferable that all the transistors included in the circuit 100 be n-channel transistors. Further alternatively, it is preferable that all the transistors provided over the same substrate as the circuit 100 be n-channel transistors. This enables a transistor including an oxide semiconductor in a channel formation region (also referred to as an OS transistor) to be used. In FIG. 1, the case where the transistors 101, 102, 103, and 104 are n-channel transistors is illustrated. However, the transistors 101, 102, 103, and 104 may be p-channel transistors. Alternatively, all the transistors included in the circuit 100 may be p-channel transistors. Further alternatively, all the transistors provided over the same substrate as the circuit 100 may be p-channel transistors. FIG. 26 illustrates a structure in which the transistor 101, the transistor 102, the transistor 103, and the transistor 104 in FIG. 1 are replaced with a transistor 101$p$, a transistor 102$p$, a transistor 103$p$, and a transistor 104$p$, respectively. The transistors 101$p$, 102$p$, 103$p$, and 104$p$ are p-channel transistors. Furthermore, also in a configuration other than the configuration in FIG. 1, an n-channel transistor may be replaced with a p-channel transistor as in the configuration in FIG. 26.

Note that description is made on the assumption that the transistors 101, 102, and 103 are n-channel transistors for convenience.

Functions of the transistors 101, 102, 103, and 104, and the capacitors 105 and 106 are described. Note that one embodiment of the present invention is not limited to the functions described below.

The transistor 101 controls conduction and non-conduction between the wiring 111 and the wiring 112. When the wiring 111 and the wiring 112 are brought into electrical contact, the potential of the wiring 111 is supplied to the wiring 112, and the potential of the wiring 112 is controlled based on the potential of the wiring 111. When the potential of the wiring 111 is at a high level, the potential of the wiring 112 is increased. In particular, when the potential of the node ND1 is higher than the sum of the potential of the wiring 111 at a high level and the threshold voltage of the transistor 101, the potential of the wiring 112 is increased to VH. When the potential of the wiring 111 is at a low level, the potential of the wiring 112 is decreased to VL.

The transistor 102 controls conduction and non-conduction between the wiring 113 and the node ND1. When the wiring 113 and the node ND1 are brought into electrical contact, the potential of the wiring 113 is supplied to the node ND1, and the potential of the node ND1 is controlled based on the potential of the wiring 113. When the potential of the wiring 113 is at a high level, the potential of the node ND1 is increased. In particular, when the potential of the node ND2 is higher than the sum of the potential of the wiring 113 at a high level and the threshold voltage of the transistor 102, the potential of the node ND1 is increased to VH. Thus, the potential of the node ND1 is set to a level at which the transistor 101 is turned on. When the potential of the wiring 113 is at a low level, the potential of the node ND1 is decreased to VL. Consequently, the potential of the node ND1 is set to a level at which the transistor 101 is turned off.

The transistor 103 controls conduction and non-conduction between the wiring 114 and the node ND2. When the wiring 114 and the node ND2 are brought into electrical contact, the potential of the wiring 114 is supplied to the node ND2, and the potential of the node ND2 is controlled based on the potential of the wiring 114. When the potential of the wiring 114 is at a high level, the potential of the node ND2 is increased. However, since the gate of the transistor 103 is connected to the wiring 114, when the potential of the node ND2 is increased to a value obtained by subtracting the threshold voltage of the transistor 103 from the potential of the wiring 114 at a high level, the transistor 103 is turned off. Thus, the node ND2 is brought into a floating state. In this manner, the potential of the node ND2 is set to a level at which the transistor 102 is turned on, and the node ND2 is brought into a floating state. Furthermore, when the potential of the wiring 114 is at a low level, the transistor 103 is turned off, leading to non-conduction between the wiring 114 and the node ND2.

Figure 2A:
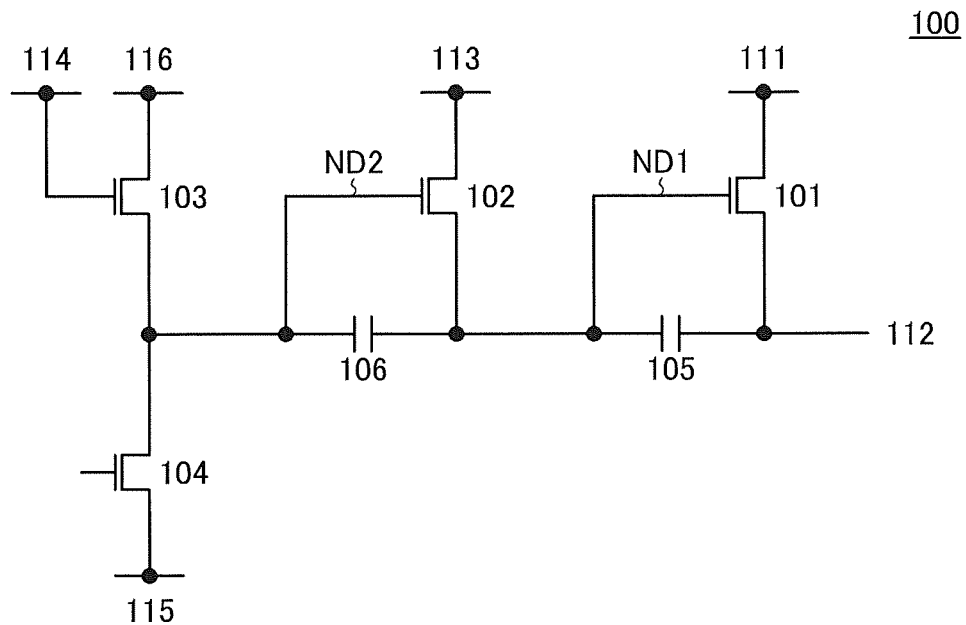
FIGS. 2A and 2B each illustrate an example of a semiconductor device.

Note that as illustrated in FIG. 2A, a first terminal and the gate of the transistor 103 may be connected to a wiring 116 and the wiring 114, respectively. The potential of the wiring 116 is preferably VH. Note that the potential of the wiring 116 can have a high level and a low level. In FIG. 2A, the transistor 103 controls conduction and non-conduction between the wiring 116 and the node ND2. When the wiring 116 and the node ND2 are brought into electrical contact, the potential of the wiring 116 is supplied to the node ND2, and the potential of the node ND2 is controlled based on the potential of the wiring 116. When the potential of the wiring 116 is VH or at a high level, the potential of the node ND2 is increased. However, since the gate of the transistor 103 is connected to the wiring 114, when the potential of the node ND2 is increased to a value obtained by subtracting the threshold voltage of the transistor 103 from the potential of the wiring 114 at a high level, the transistor 103 is turned off. Thus, the node ND2 is brought into a floating state. In this manner, the potential of the node ND2 is set to a level at which the transistor 102 is turned on, and the node ND2 is brought into a floating state.

Figure 2B:
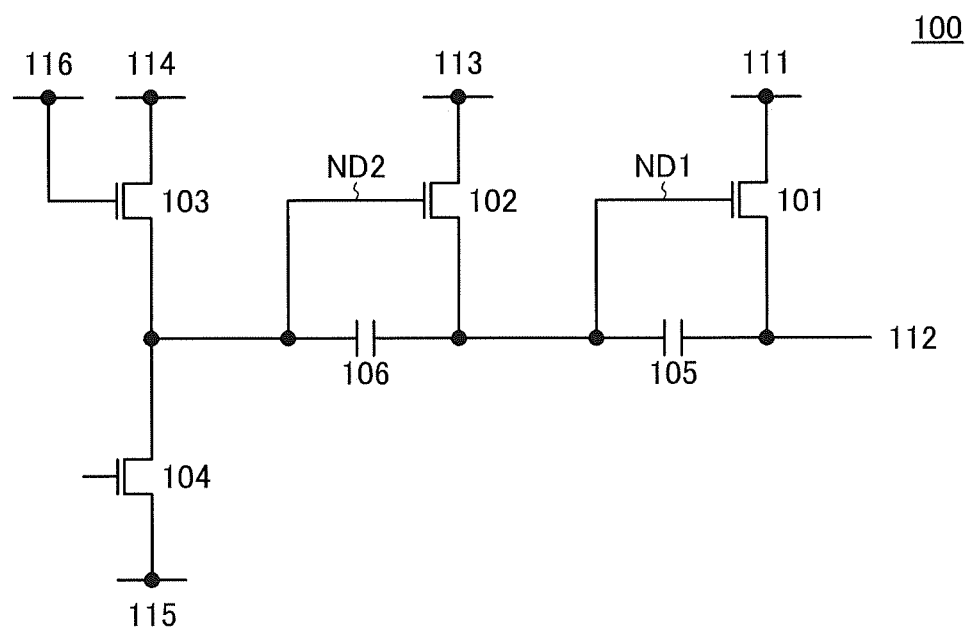

Note that as illustrated in FIG. 2B, the first terminal and the gate of the transistor 103 may be connected to the wiring 114 and the wiring 116, respectively. In FIG. 2B, the transistor 103 controls conduction and non-conduction between the wiring 114 and the node ND2. When the wiring 114 and the node ND2 are brought into electrical contact, the potential of the wiring 114 is supplied to the node ND2, and the potential of the node ND2 is controlled based on the potential of the wiring 114. When the potential of the wiring 114 is at a high level, the potential of the node ND2 is increased. However, since the gate of the transistor 103 is connected to the wiring 116, when the potential of the node ND2 is increased to a value obtained by subtracting the threshold voltage of the transistor 103 from the potential of the wiring 116, the transistor 103 is turned off. Thus, the node ND2 is brought into a floating state. In this manner, the potential of the node ND2 is set to a level at which the transistor 102 is turned on, and the node ND2 is brought into a floating state. When the potential of the wiring 114 is at a low level, the potential of the node ND2 is decreased to VL. Thus, the potential of the node ND2 is set to a level at which the transistor 102 is turned off.

Figure 3A:
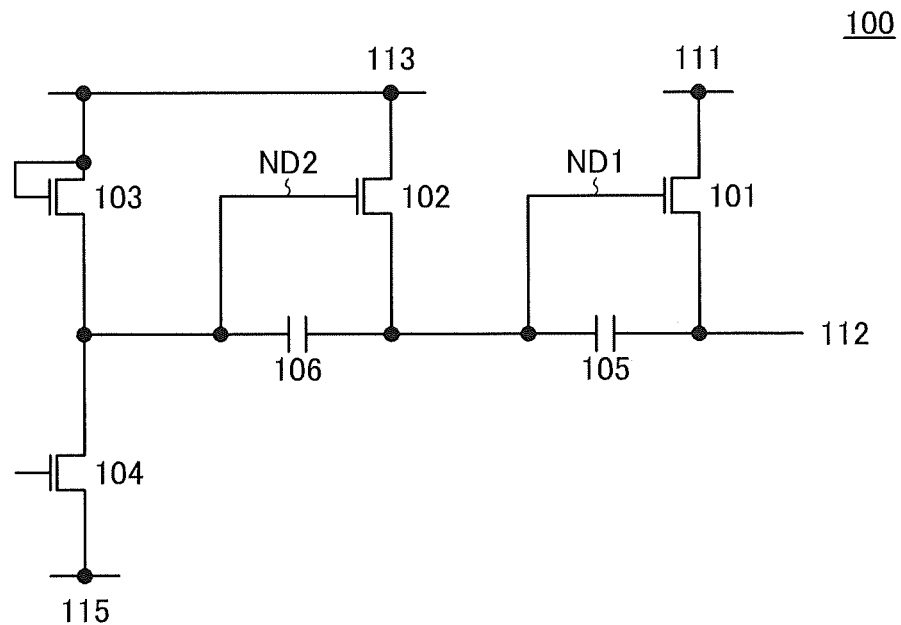
FIGS. 3A and 3B each illustrate one example of a semiconductor device.

Note that as illustrated in FIG. 3A, the first terminal and the gate of the transistor 103 may be connected to the wiring 113. In FIG. 3A, the transistor 103 controls conduction and non-conduction between the wiring 113 and the node ND2. When the wiring 113 and the node ND2 are brought into electrical contact, the potential of the wiring 113 is supplied to the node ND2, and the potential of the node ND2 is controlled based on the potential of the wiring 113. When the potential of the wiring 113 is at a high level, the potential of the node ND2 is increased. However, since the gate of the transistor 103 is connected to the wiring 113, when the potential of the node ND2 is increased to a value obtained by subtracting the threshold voltage of the transistor 103 from the potential of the wiring 113 at a high level, the transistor 103 is turned off. Thus, the node ND2 is brought into a floating state. In this manner, the potential of the node ND2 is set to a level at which the transistor 102 is turned on, and the node ND2 is brought into a floating state. Furthermore, when the potential of the wiring 113 is at a low level, the transistor 104 is turned off, leading to non-conduction between the wiring 113 and the node ND2.

Figure 3B:
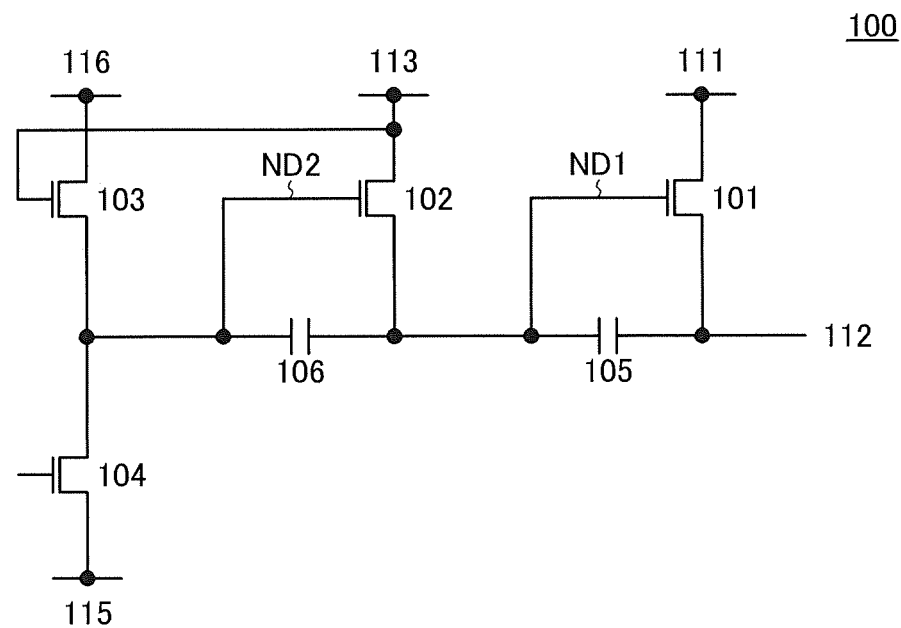

Note that as illustrated in FIG. 3B, the first terminal and the gate of the transistor 103 may be connected to the wiring 116 and the wiring 113, respectively. In FIG. 3B, the transistor 103 controls conduction and non-conduction between the wiring 116 and the node ND2. When the wiring 116 and the node ND2 are brought into electrical contact, the potential of the wiring 116 is supplied to the node ND2, and the potential of the node ND2 is controlled based on the potential of the wiring 116. When the potential of the wiring 116 is at VH or a high level, the potential of the node ND2 is increased. However, since the gate of the transistor 103 is connected to the wiring 113, when the potential of the node ND2 is increased to a value obtained by subtracting the threshold voltage of the transistor 103 from the potential of the wiring 113 at a high level, the transistor 103 is turned off. Thus, the node ND2 is brought into a floating state. In this manner, the potential of the node ND2 is set to a level at which the transistor 102 is turned on, and the node ND2 is brought into a floating state.

Note that although not illustrated, the first terminal and the gate of the transistor 103 may be connected to the wiring 114 and the wiring 113, respectively.

Note that although not illustrated, the first terminal and the gate of the transistor 103 may be connected to the wiring 113 and the wiring 116, respectively.

The transistor 104 controls conduction and non-conduction between the wiring 115 and the node ND2. When the wiring 115 and the node ND2 are brought into electrical contact, the potential of the wiring 115 is supplied to the node ND2, and the potential of the node ND2 is controlled based on the potential of the wiring 115. When the potential of the wiring 115 is at VL or a low level, the potential of the node ND2 is decreased to VL. Thus, the potential of the node ND2 is set to a level at which the transistor 102 is turned off.

Figure 4A:
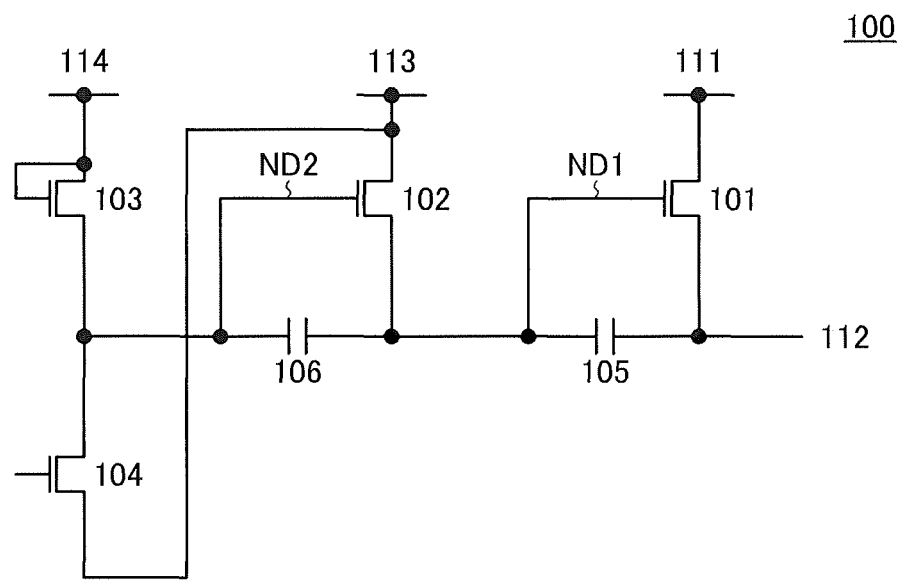
FIGS. 4A and 4B each illustrate an example of a semiconductor device.

Note that as illustrated in FIG. 4A, the first terminal of the transistor 104 may be connected to the wiring 113. In FIG. 4A, the transistor 104 controls conduction and non-conduction between the wiring 113 and the node ND2. When the wiring 113 and the node ND2 are brought into electrical contact, the potential of the wiring 113 is supplied to the node ND2, and the potential of the node ND2 is controlled based on the potential of the wiring 113. When the potential of the wiring 113 is at VL or a low level, the potential of the node ND2 is decreased to VL. Thus, the potential of the node ND2 is set to a level at which the transistor 102 is turned off.

Figure 4B:
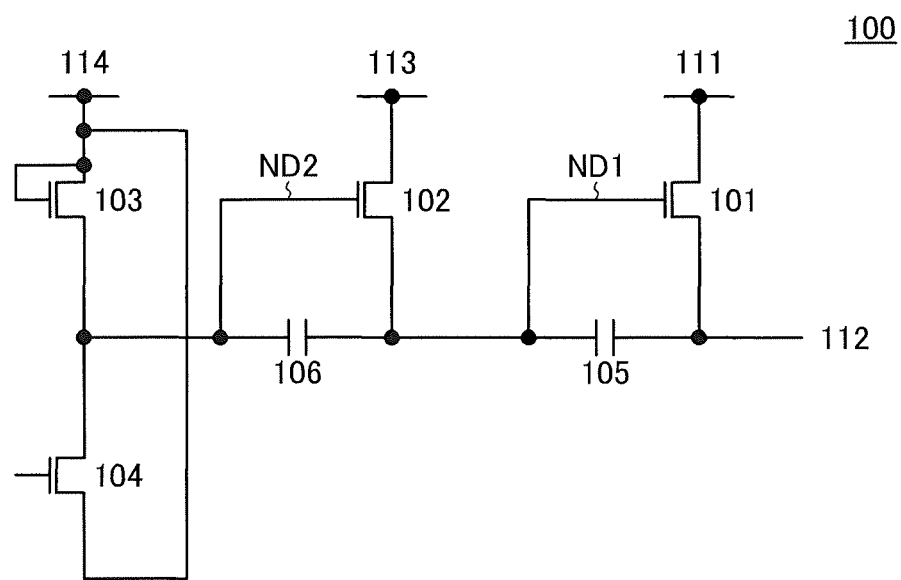

Note that as illustrated in FIG. 4B, the first terminal of the transistor 104 may be connected to the wiring 114. In FIG. 4B, the transistor 104 controls conduction and non-conduction between the wiring 114 and the node ND2. When the wiring 114 and the node ND2 are brought into electrical contact, the potential of the wiring 114 is supplied to the node ND2, and the potential of the node ND2 is controlled based on the potential of the wiring 114. When the potential of the wiring 114 is at VL or a low level, the potential of the node ND2 is decreased to VL. Thus, the potential of the node ND2 is set to a level at which the transistor 102 is turned off.

Figure 5A:
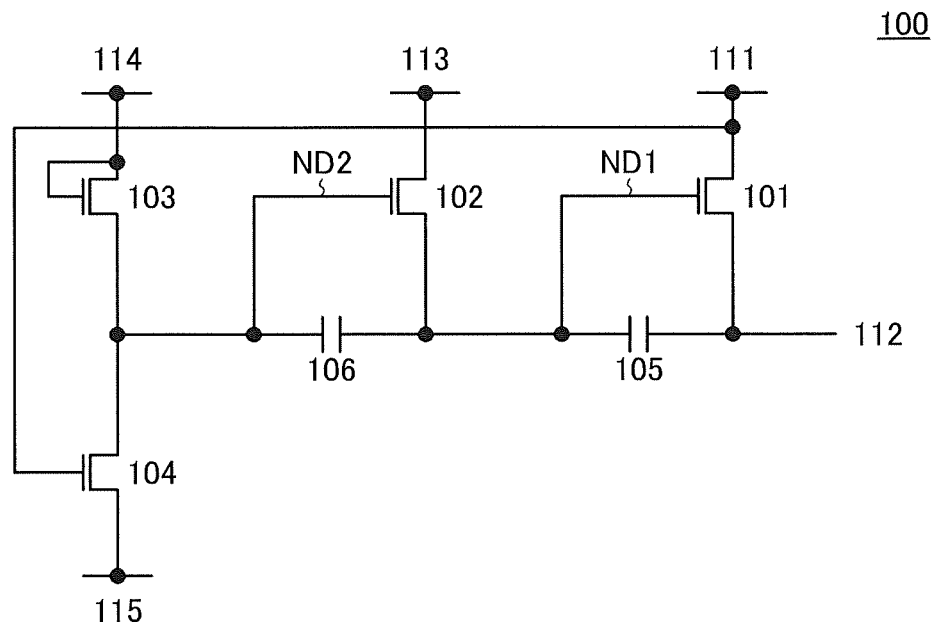
FIGS. 5A and 5B each illustrate an example of a semiconductor device.

Note that as illustrated in FIG. 5A, the gate of the transistor 104 may be connected to the wiring 111.

Figure 5B:
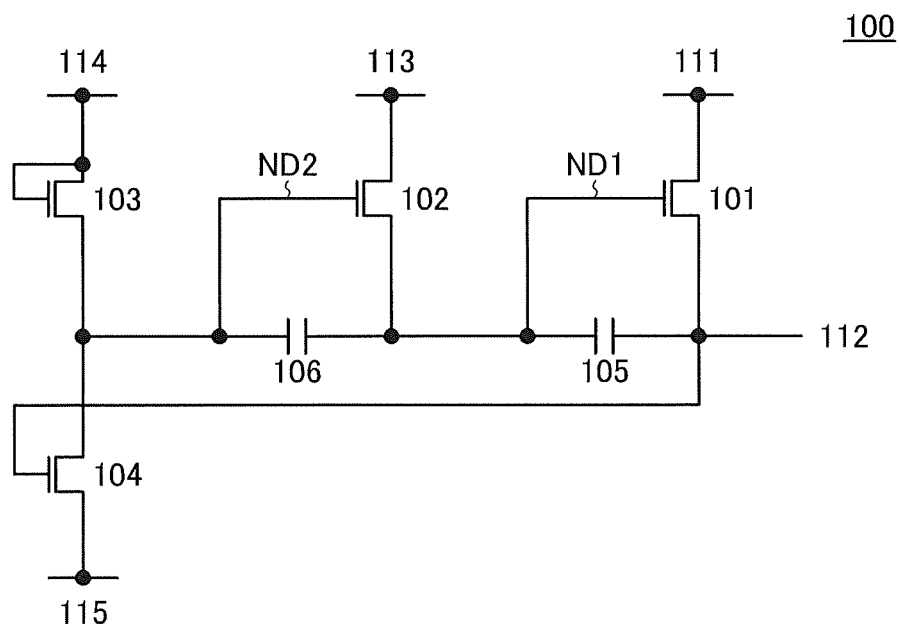

Note that as illustrated in FIG. 5B, the gate of the transistor 104 may be connected to the wiring 112.

The capacitor 105 holds a potential difference between the wiring 112 and the node ND1. When the node ND1 is in a floating state, the potential of the node ND1 is changed based on a change in the potential of the wiring 112. Accordingly, when the potential of the node ND1 is increased in accordance with the increase in the potential of the wiring 112, the potential of the node ND1 can become higher than the sum of the potential of the wiring 111 at a high level and the threshold voltage of the transistor 101.

Figure 6A:
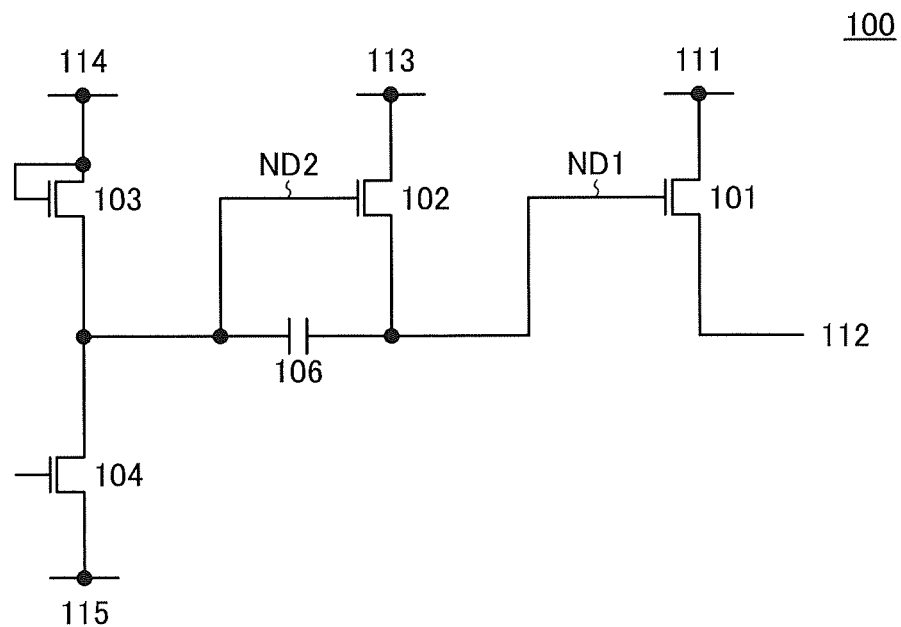
FIGS. 6A and 6B each illustrates an example of a semiconductor device.

Note that as illustrated in FIG. 6A, the capacitor 105 may be omitted. The potential difference between the wiring 112 and the node ND1 is held by parasitic capacitance between the second terminal and the gate of the transistor 101.

The capacitor 106 holds a potential difference between the node ND1 and the node ND2. When the node ND2 is in a floating state, the potential of the node ND2 is changed based on a change in the potential of the node ND1. Accordingly, when the potential of the node ND2 is increased in accordance with the increase in the potential of the node ND1, the potential of the node ND2 can become higher than the sum of the potential of the wiring 113 at a high level and the threshold voltage of the transistor 102.

Figure 6B:
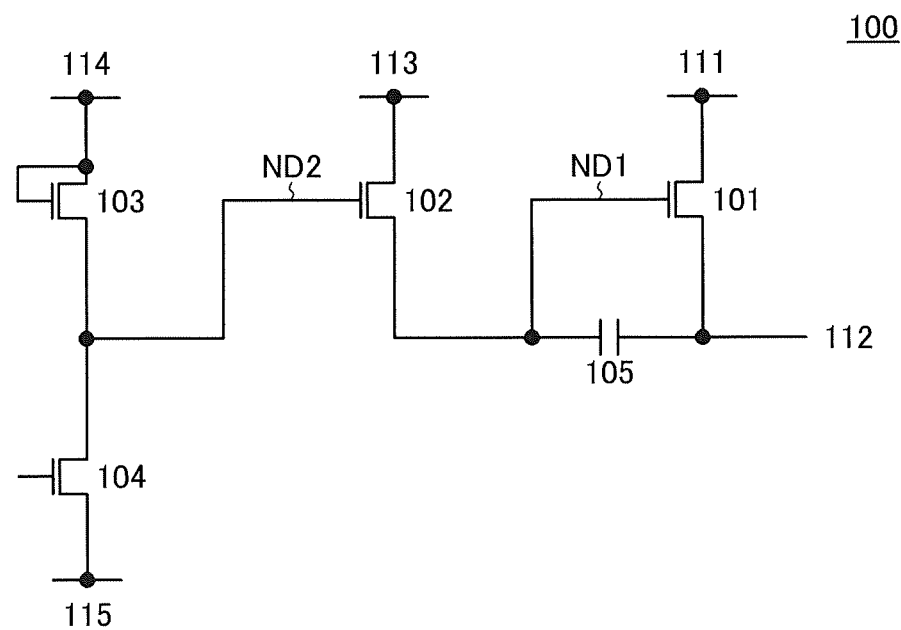

Note that as illustrated in FIG. 6B, the capacitor 106 may be omitted. The potential difference between the node ND1 and the node ND2 is held by parasitic capacitance between the second terminal and the gate of the transistor 102.

Note that the transistors 101, 102, 103, and 104, and the capacitors 105 and 106 do not necessarily have all the functions described above.

Note that the configurations of the circuit 100 described with reference to FIG. 1, FIGS. 2A and 2B, FIGS. 3A and 3B, FIGS. 4A and 4B, FIGS. 5A and 5B, FIGS. 6A and 6B, and the like; and a configuration of the circuit 100 described without a drawing can be combined as appropriate.

Operation of the semiconductor device in this embodiment is described using the configuration in FIG. 1 as an example. Note that one embodiment of the present invention is not limited to the operation described below.

Figure 7:
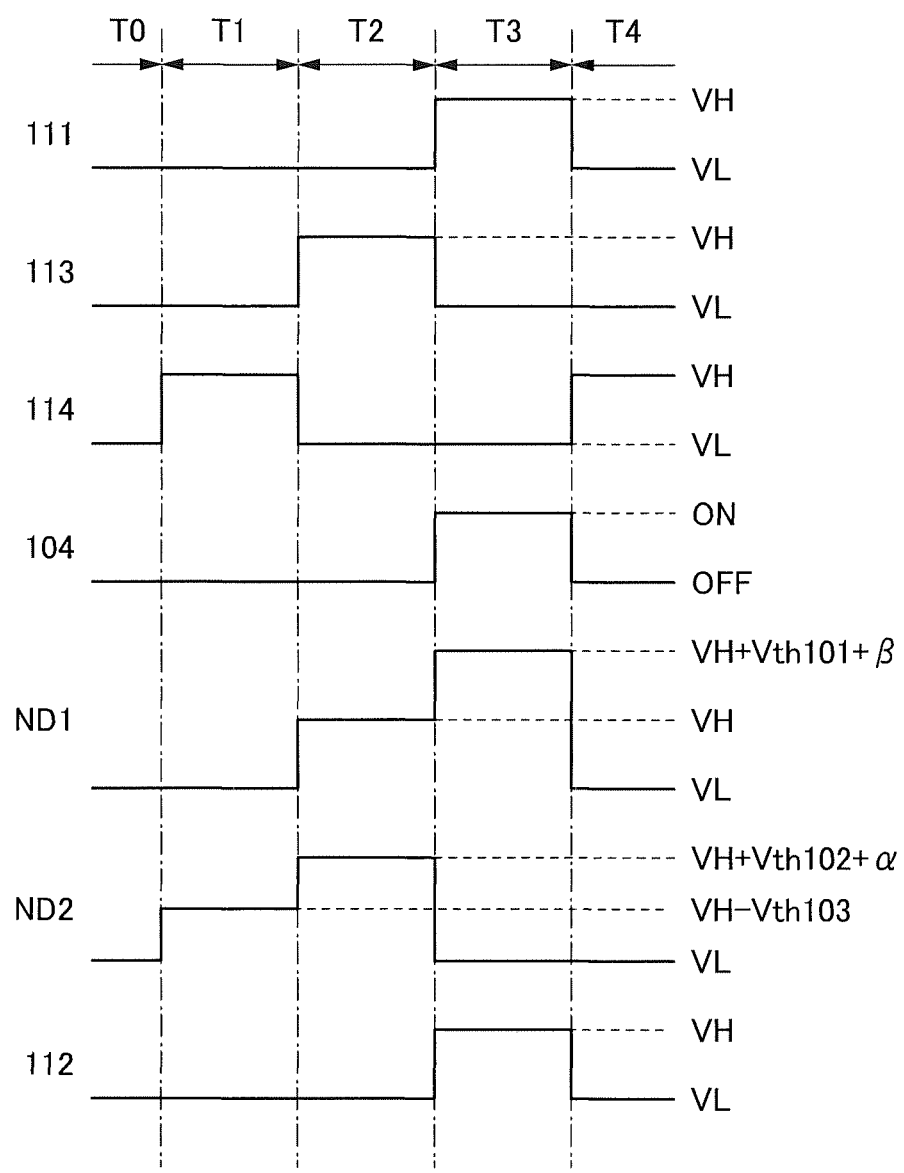
FIG. 7 is a timing chart showing an example of operation of a semiconductor device.

A timing chart in FIG. 7 shows, as an example, the potential of the wiring 111, the potential of the wiring 113, the potential of the wiring 114, on/off of the transistor 104, the potential of the node ND1, the potential of the node ND2, and the potential of the wiring 112.

For convenience's sake, four periods, that is, a period T1, a period T2, a period T3, and a period T4 are described separately. For example, one frame period has the periods T1 to T4.

Note that for convenience, in a period T0 just before the period T1, the potential of the wiring 111 is at a low level, the potential of the wiring 113 is at a low level, the potential of the wiring 114 is at a low level, the potential of the node ND1 is VL, the potential of the node ND2 is VL, and the potential of the wiring 112 is VL. Since the potential of the node ND1 is VL, the transistor 101 is off. Furthermore, since the potential of the node ND2 is VL, the transistor 102 is off.

Figure 8A:
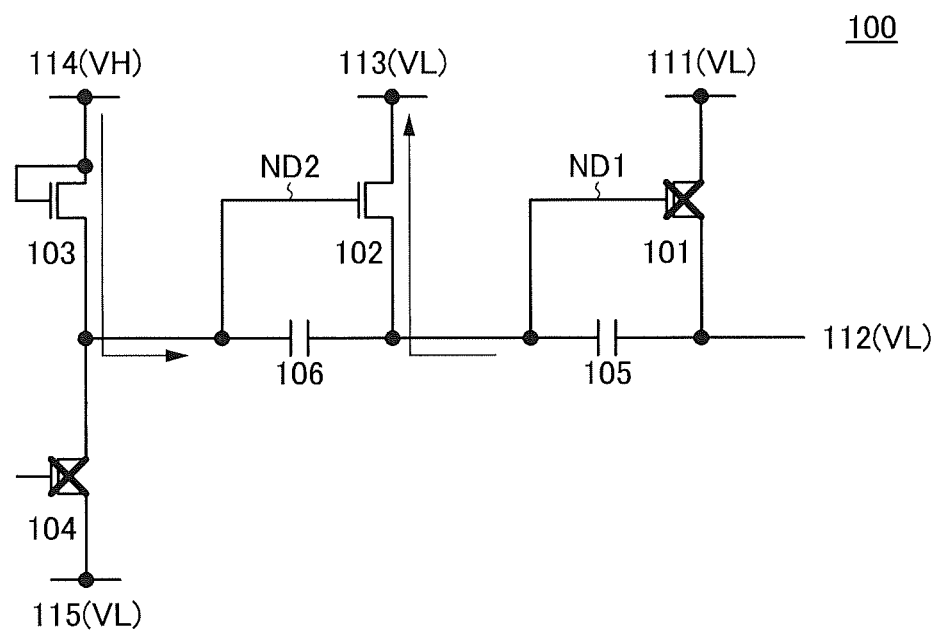
FIGS. 8A and 8B illustrate an example of a semiconductor device.

The operation in the period T1 is described with reference to FIG. 8A. The potential of the wiring 111 is kept at a low level, the potential of the wiring 113 is kept at a low level, the potential of the wiring 114 is changed from a low level to a high level, and the transistor 104 is kept off.

The transistor 103 is turned on because the potential of the wiring 114 is set at a high level. Accordingly, the potential of the wiring 114 at a high level is supplied to the node ND2; therefore, the potential of the node ND2 is increased from VL.

After that, when the potential of the node ND2 is higher than the sum (VL+Vth102) of the potential of the first terminal of the transistor 102 (VL) and the threshold voltage of the transistor 102 (Vth102), the transistor 102 is turned on. Accordingly, the potential of the wiring 113 at a low level is supplied to the node ND1, and thus the potential of the node ND1 is kept at VL. The transistor 101 is kept off because the potential of the node N1 is kept at VL. Thus, the potential of the wiring 112 is kept at VL.

After that, when the potential of the node ND2 is increased to a value (VH−Vth103) obtained by subtracting the threshold voltage of the transistor 103 (Vth103) from the potential of the gate of the transistor 103 (VH), the transistor 103 is turned off. Thus, the node ND2 is brought into a floating state, and the potential of the node ND2 is kept at VH−Vth103.

Note that in FIG. 2A, since the first terminal of the transistor 103 is connected to the wiring 116, the potential of the wiring 116 (e.g. VH) is supplied to the node ND2.

Figure 8B:
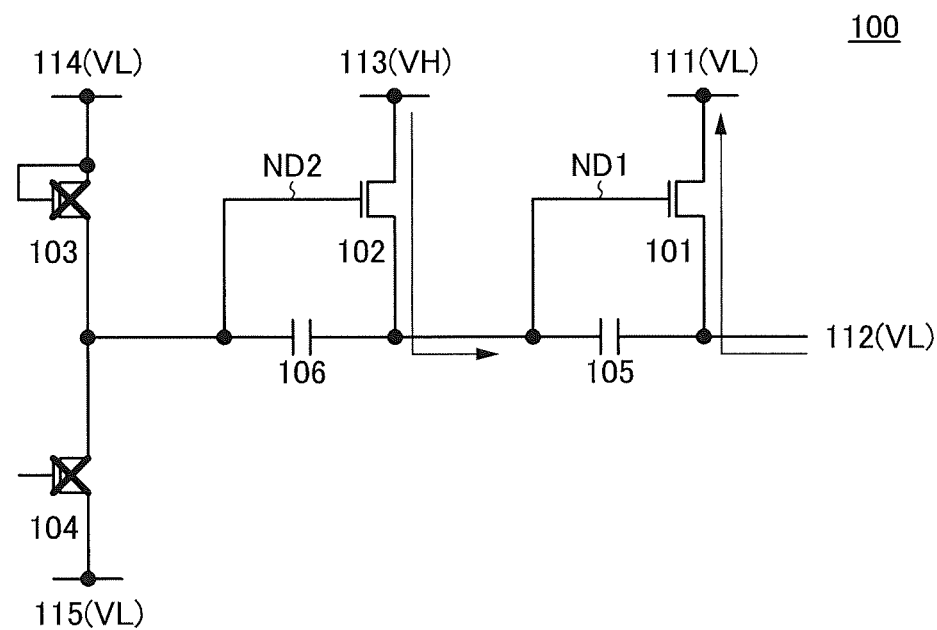

The operation in the period T2 is described with reference to FIG. 8B. The potential of the wiring 111 is kept at a low level, the potential of the wiring 113 is changed from a low level to a high level, the potential of the wiring 114 is changed from a high level to a low level, and the transistor 104 is kept off.

Since the potential of the wiring 114 is set at a low level, the transistor 103 is kept off. Accordingly, the node ND2 is kept in a floating state, and thus the potential of the node ND2 is kept at VH−Vth103. Since the potential of the node ND2 is kept at VH−Vth103, the transistor 102 is kept on. Accordingly, the potential of the wiring 113 at a high level is supplied to the node ND1, and thus the potential of the node ND1 is increased from VL. At this time, the capacitor 106 holds a potential difference between the node ND1 and the node ND2, and the node ND2 is in a floating state. Accordingly, the potential of the node ND2 is increased from VH−Vth103 in accordance with the increase in the potential of the node ND1.

After that, when the potential of the node ND1 is higher than the sum (VL+Vth 101) of the potential of the first terminal of the transistor 101 (VL) and the threshold voltage of the transistor 101 (Vth101), the transistor 101 is turned on. Accordingly, the potential of the wiring 111 at a low level is supplied to the wiring 112, and thus the potential of the wiring 112 is kept at VL.

After that, when the potential of the node ND2 is increased to a level (VH+Vth102+α (α is a positive number)) higher than the sum of the potential of the first terminal of the transistor 102 (VH) and the threshold voltage of the transistor 102 (Vth102) in accordance with the increase in the potential of the node ND1, the potential of the node ND1 is increased to VH.

Note that in FIG. 2B, it is preferable that the potential of the wiring 114 be kept at a high level in the period T2 in order to keep the transistor 103 off.

Note that in FIGS. 3A and 3B, the transistor 103 is turned on in the period T2 for the first time after the period T0. Specifically, when the potential of the wiring 113 is set at a high level, the transistor 103 is turned on. Accordingly, in FIG. 3A, the potential of the wiring 113 at a high level is supplied to the node ND2, and thus the potential of the node ND2 is increased from VL. On the other hand, in FIG. 3B, the potential of the wiring 116 (e.g. VH) is supplied to the node ND2, and thus the potential of the node ND2 is increased from VL. After that, when the potential of the node ND2 is higher than VL+Vth102, the transistor 102 is turned on. Accordingly, the potential of the wiring 113 at a high level is supplied to the node ND1, and thus the potential of the node ND1 is increased from VL. After that, when the potential of the node ND2 is set at VH−Vth103, the transistor 103 is turned off, and thus the node ND2 is brought into a floating state. At this time, the potential of the node ND1 is increased. The capacitor 106 holds a potential difference between the node ND1 and the node ND2. Accordingly, the potential of the node ND2 is increased from VH−Vth103 in accordance with the increase in the potential of the node ND1. After that, when the potential of the node ND1 is higher than VL+Vth101, the transistor 101 is turned on. Accordingly, the potential of the wiring 111 at a low level is supplied to the wiring 112, and thus the potential of the wiring 112 is kept at VL. After that, when the potential of the node ND2 is increased to VH+Vth102+α in accordance with the increase in the potential of the node ND1, the potential of the node ND1 is increased to VH. As described above, in FIGS. 3A and 3B, the operation in the periods T1 and T2 of FIG. 1 can be collectively performed in the period T2. Consequently, the operation speed can be improved.

Figure 9A:
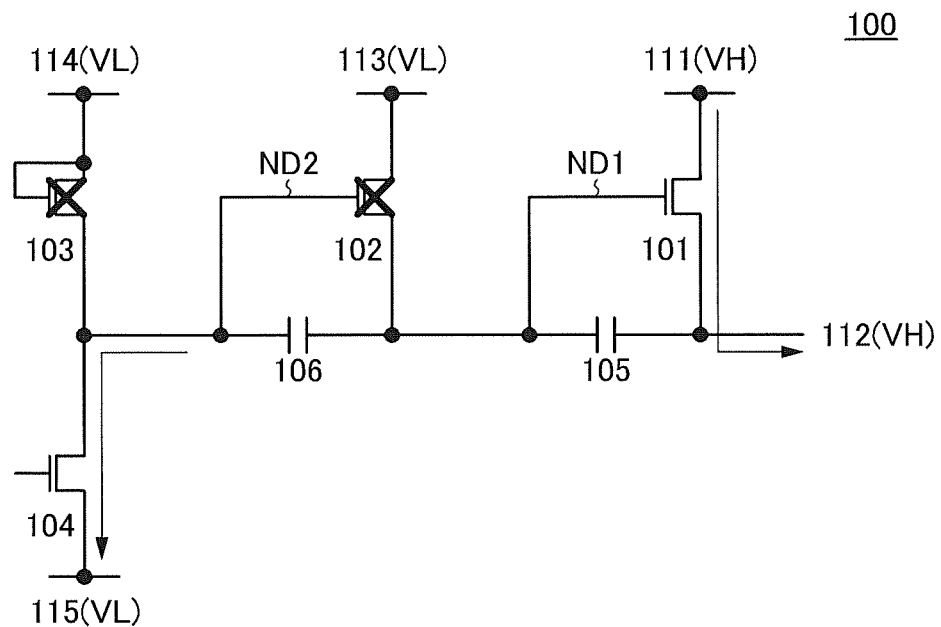
FIGS. 9A and 9B illustrate an example of a semiconductor device.

The operation in the period T3 is described with reference to FIG. 9A. The potential of the wiring 111 is changed from a low level to a high level, the potential of the wiring 113 is changed from a high level to a low level, the potential of the wiring 114 is kept at a low level, and the transistor 104 is changed from an off state to an on state.

Since the potential of the wiring 114 is kept at a low level, the transistor 103 is kept off. The transistor 104 is turned on. Accordingly, the potential of the wiring 115 is supplied to the node ND2, and thus the potential of the node ND2 is decreased from VH+Vth102+α to VL. Since the potential of the node ND2 is set at VL, the transistor 102 is turned off. Thus, the node ND1 is brought into a floating state, and the potential of the node ND1 is kept at VH. Since the potential of the node ND1 is kept at VH, the transistor 101 is kept on. Accordingly, the potential of the wiring 111 at a high level is supplied to the wiring 112, and thus the potential of the wiring 112 is increased from VL. At this time, the capacitor 105 holds a potential difference between the wiring 112 and the node ND1, and the node ND1 is in a floating state. Thus, the potential of the node ND1 is increased from VH in accordance with the increase in the potential of the wiring 112.

After that, when the potential of the node ND1 is increased to a level (VH+Vth101+β (β is a positive number)) higher than the sum of the potential of the first terminal of the transistor 101 (VH) and the threshold voltage of the transistor 101 (Vth101) in accordance with the increase in the potential of the wiring 112, the potential of the wiring 112 is increased to VH.

Note that in FIG. 4A, since the first terminal of the transistor 104 is connected to the wiring 113, the potential of the wiring 113 at a low level is supplied to the node ND2. Furthermore, in FIG. 4B, since the first terminal of the transistor 104 is connected to the wiring 114, the potential of the wiring 114 at a low level is supplied to the node ND2.

Figure 9B:
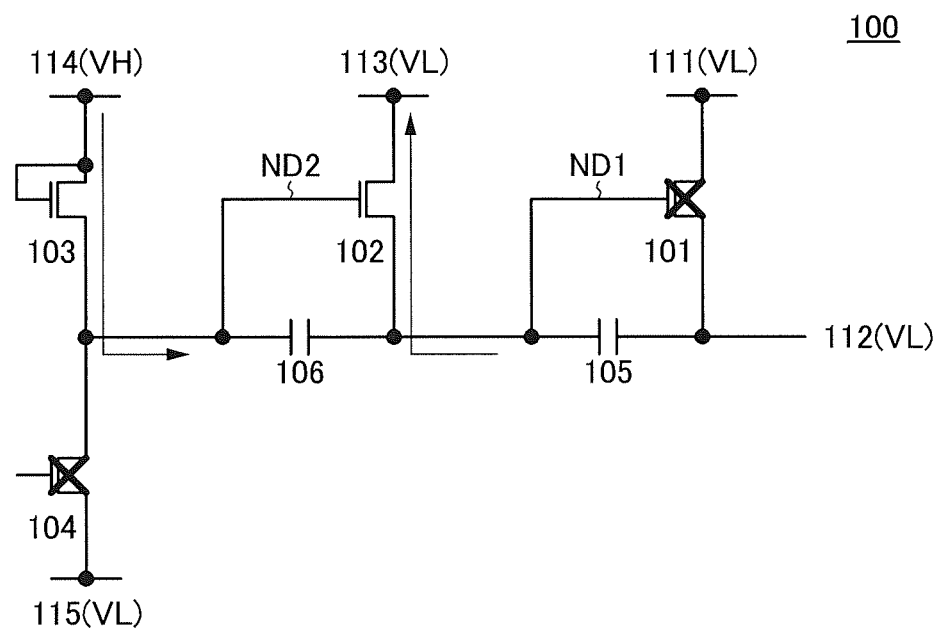

The operation in the period T4 is described with reference to FIG. 9B. The potential of the wiring 111 is changed from a high level to a low level, the potential of the wiring 113 is kept at a low level, the potential of the wiring 114 is changed from a low level to a high level, and the transistor 104 is changed from on to off.

Since the potential of the wiring 114 is set at a high level, the transistor 103 is turned on. Accordingly, the potential of the wiring 114 at a high level is supplied to the node ND2, and thus the potential of the node ND2 is increased. At this time, the potential of the node ND1 is VH+Vth101+β, and accordingly the transistor 101 is kept on. Accordingly, the potential of the wiring 111 at a low level is supplied to the wiring 112, and thus the potential of the wiring 112 is decreased from VH to VL.

After that, when the potential of the node ND2 is higher than the sum of the potential of the first terminal of the transistor 102 (VL) and the threshold voltage of the transistor 102 (Vth102), the transistor 102 is turned on. Accordingly, the potential of the wiring 113 at a low level is supplied to the node ND1, and thus the potential of the node ND1 is decreased from VH+Vth101+β to VL. The transistor 101 is turned off because the potential of the node ND1 is set at VL.

After that, when the potential of the node ND2 is increased to a level obtained by subtracting the threshold voltage of the transistor 103 (Vth103) from the potential of the gate of the transistor 103 (VH), the transistor 103 is turned off. Thus, the node ND2 is brought into a floating state, and the potential of the node ND2 is kept at VH−Vth103.

Note that since the first terminal of the transistor 103 is connected to the wiring 116 in FIG. 2A, the potential of the wiring 116 (e.g. VH) is supplied to the node ND2.

The semiconductor device in this embodiment has connection relations which enable the above operation, whereby the potential of the node ND2 can be set at VH+Vth102+α.

In the semiconductor device in this embodiment, the potential of the node ND2 is set at VH+Vth102+α, whereby a potential difference between the gate and the source of the transistor 102 can be kept at a level higher than the threshold voltage of the transistor 102.

In the semiconductor device in this embodiment, the potential difference between the gate and the source of the transistor 102 is kept at a level higher than the threshold voltage of the transistor 102, whereby the potential of the node ND1 can be increased to VH.

In the semiconductor device in this embodiment, the potential difference between the gate and the source of the transistor 102 is kept at a level higher than the threshold voltage of the transistor 102, whereby the time required for change in the potential of the node ND1 can be shortened.

In the semiconductor device in this embodiment, the potential of the node ND1 is increased to VH, whereby the potential difference between the gate and the source of the transistor 101 can be made large.

In the semiconductor device in this embodiment, the potential difference between the gate and the source of the transistor 101 is made large, whereby the time required for change in the potential of the wiring 112 can be shortened. That is, a signal whose rise time and the fall time are short can be output to the wiring 112.

In the semiconductor device in this embodiment, the potential difference between the gate and the source of each of the transistors 101 and 102 is made large, whereby a driving voltage can be made low. This reduces the power consumption.

In the semiconductor device in this embodiment, the potential differences between the gates and the sources of the transistors 101 and 102 are made large, whereby the channel width of each of the transistors 101 and 102 can be made small. Thus, the layout area can be decreased.

Since the time required for change in the potential of the node ND1 and the time required for change in the potential of the wiring 112 can be shortened in the semiconductor device in this embodiment, the operation speed can be improved.

W/L (W is the channel width and L is the channel length) of each of the transistors 101, 102, 103, and 104 is described. Note that one embodiment of the present invention is not limited to the W/L described below.

The transistor 101 drives a potential of the wiring 112, the transistor 102 drives a potential of the node ND1, and the transistors 103 and 104 drive a potential the node ND2. The load of the wiring 112 is often larger than any of the loads of the node ND1 and the node ND2. Therefore, W/L of the transistor 101 is preferably larger than that of the transistors 102, 103, and 104. Alternatively, the W/L of the transistor 101 is preferably the largest among the transistors included in the circuit 100. Further alternatively, the W/L of the transistor 101 is preferably the largest among transistors provided over the same substrate as the circuit 100. Note that a transistor whose W/L is the same or substantially the same as that of the transistor 101 may be provided. In this manner, the drive capability of the transistor 101 can be improved, which enables the load of the wiring 112 to be made large. Furthermore, the transistors 102, 103, and 104 can be downsized, leading to reduction in a layout area.

Even when the potential of the node ND1 is increased, the potential difference between the gate and the source of the transistor 102 can be kept at a level of greater than or equal to the threshold voltage of the transistor 102, and thus the W/L of the transistor 102 can be made low. On the other hand, when the potential of the node ND2 is increased, a potential difference between the gate and the source of the transistor 103 is decreased gradually; therefore, the W/L of the transistor 103 is preferably high. Therefore, the W/L of the transistor 103 is preferably higher than that of the transistor 102. In this manner, the drive capability of the transistor 103 can be improved, and thus the time required for change in the potential of the node ND2 can be shortened. Furthermore, reduction in size of the transistor 102 can be achieved, leading to reduction in a layout area. But it is also possible to make the W/L of the transistor 102 higher than that of the transistor 103.

A transistor which can be additionally included in any of the configurations of the circuit 100 described with reference to FIG. 1, FIGS. 2A and 2B, FIGS. 3A and 3B, FIGS. 4A and 4B, FIGS. 5A and 5B, and FIGS. 6A and 6B; the configuration of the circuit 100 described without a drawing; and a configuration obtained by combining them is described. Note that one embodiment of the present invention is not limited to a configuration described below.

Figure 10A:
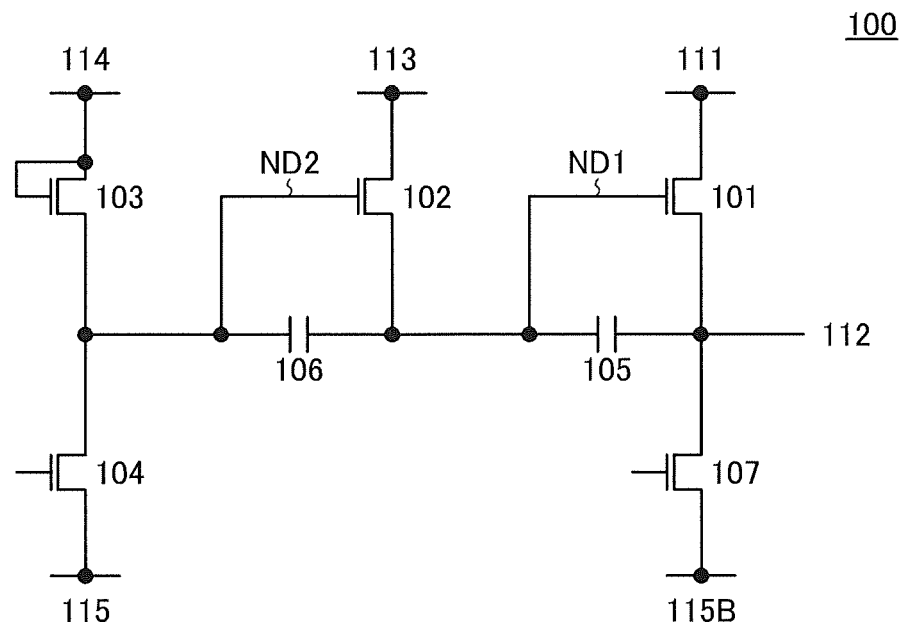
FIGS. 10A and 10B each illustrate an example of a semiconductor device.

A transistor 107 may be additionally included in any of the above configurations of the circuit 100. FIG. 10A illustrates a case where the transistor 107 is additionally included in the circuit 100 in FIG. 1. A first terminal and a second terminal of the transistor 107 are connected to a wiring 115B and the wiring 112, respectively. The potential of the wiring 115B is preferably VL. Note that the potential of the wiring 115B may have a high level and a low level. The transistor 107 controls conduction and non-conduction between the wiring 115B and the wiring 112. When the transistor 107 is turned on, the wiring 115B and the wiring 112 are brought into electrical contact, and the potential of the wiring 112 is controlled based on the potential of the wiring 115B. When the potential of the wiring 115B is VL or at a low level, the potential of the wiring 112 is VL. Furthermore, the transistor 107 preferably has the same polarity as the transistors 101 to 104.

In the period T1, the transistor 107 is turned on. Accordingly, the potential of the wiring 115B is supplied to the wiring 112, and thus the potential of the wiring 112 is set at VL. Note that in the period T1, the transistor 107 may be off.

In the period T2, the transistor 107 is turned on. Accordingly, the potential of the wiring 115B is supplied to the wiring 112, and thus the potential of the wiring 112 is set at VL. Note that in the period T2, the transistor 107 may be off.

In the period T3, the transistor 107 is turned off.

In the period T4, the transistor 107 is turned on. Accordingly, the potential of the wiring 115B is supplied to the wiring 112, and thus the potential of the wiring 112 is set at VL. Note that in the period T4, the transistor 107 may be off.

In FIG. 10A, the circuit 100 includes the transistor 107, whereby the wiring 112 is prevented from being brought into a floating state, which can stabilize the potential of the wiring 112. Accordingly, malfunctions can be prevented.

Note that the first terminal of the transistor 107 may be connected to the wiring 111, 113, 114, or 115. A gate of the transistor 107 may be connected to the wiring 113 or 114.

Figure 10B:
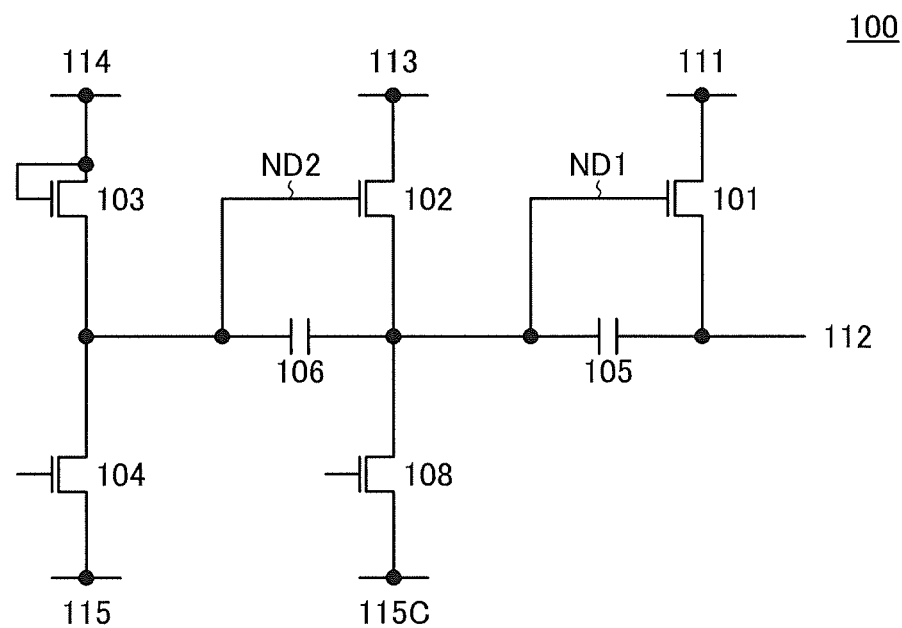

A transistor 108 may be additionally included in the circuit 100 having any of the above configurations. FIG. 10B illustrates a case where the transistor 108 is additionally included in the circuit 100 in FIG. 1. A first terminal and a second terminal of the transistor 108 are connected to a wiring 115C and the node ND1, respectively. The potential of the wiring 115C is preferably VL. Note that the potential of the wiring 115C may have a high level and a low level. The transistor 108 controls conduction and non-conduction between the wiring 115C and the node ND1. When the transistor 108 is turned on, the wiring 115C and the node ND1 are brought into electrical contact, and the potential of the node ND1 is controlled based on the potential of the wiring 115C. When the potential of the wiring 115C is VL or at a low level, the potential of the node ND1 is set at VL. Thus, the potential of the node ND1 is set to a level at which the transistor 101 is turned off. Furthermore, the transistor 108 preferably has the same polarity as the transistors 101 to 104.

In the period T1, the transistor 108 is turned on. Accordingly, the potential of the wiring 115C is supplied to the node ND1, and thus the potential of the node ND1 is set at VL. Note that in the period T1, the transistor 108 may be off.

In the period T2, the transistor 108 is turned off.

In the period T3, the transistor 108 is turned off.

In the period T4, the transistor 108 is turned on. Accordingly, the potential of the wiring 115C is supplied to the node ND1, and thus the potential of the node ND1 is set at VL. Note that in the period T4, the transistor 108 may be off.

In FIG. 10B, the circuit 100 includes the transistor 108, whereby the node ND1 is prevented from being brought into a floating state, which can stabilize the potential of the node ND1. Accordingly, malfunctions can be prevented.

Note that the first terminal of the transistor 108 may be connected to the wirings 111, 113, 114, or 115. A gate of the transistor 108 may be connected to the wiring 114.

Note that in the case where the transistors 107 and 108 are both additionally included in the circuit 100, the gate of the transistor 107 may be connected to the gate of the transistor 108. Alternatively, the first terminal of the transistor 107 may be connected to the first terminal of the transistor 108.

Figure 11A:
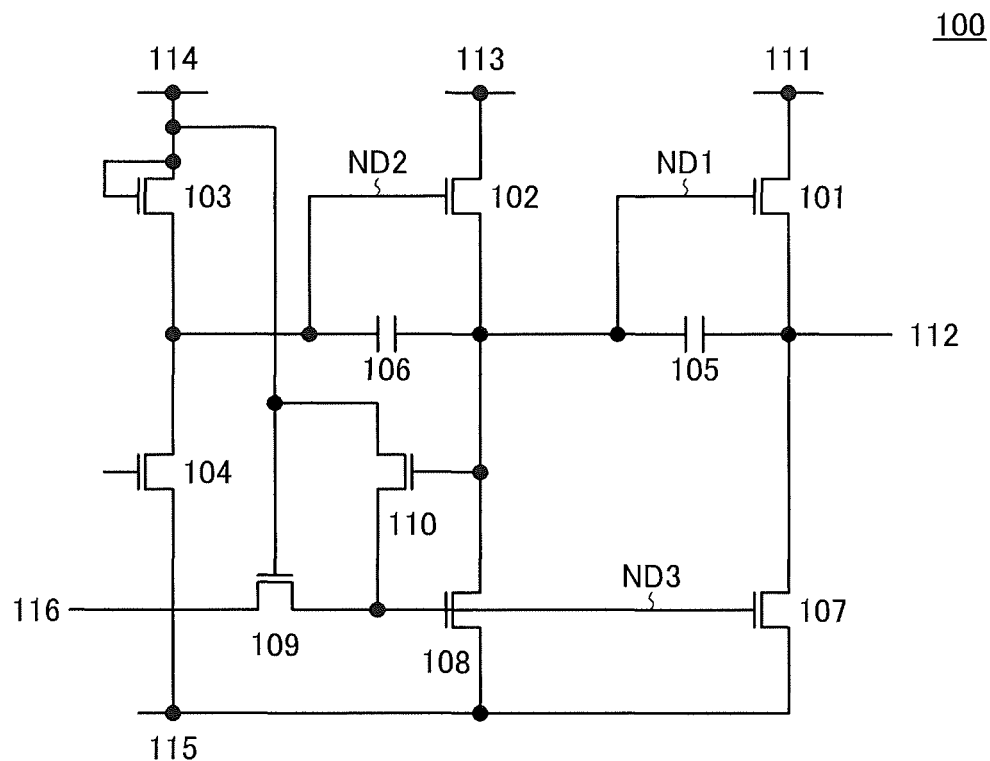
FIGS. 11A and 11B each illustrate examples of a semiconductor device.

In the circuit 100 having any of the above configurations, the transistors 107 and/or 108 may be additionally included, and a transistor 109 and a transistor 110 may be additionally included. FIG. 11A illustrates a case where the transistors 109 and 110 are additionally included in addition to the transistors 107 and 108 in the circuit 100 illustrated in FIG. 1. The first terminal of the transistor 109 is connected to the wiring 116, the second terminal of the transistor 109 is connected to the gates of the transistors 107 and 108, and the gate of the transistor 109 is connected to the wiring 114. A first terminal, a second terminal, and a gate of the transistor 110 are connected to the wiring 114, the gates of the transistors 107 and 108, and the node ND1, respectively. Note that the gate of the transistor 107, the gate of the transistor 108, the second terminal of the transistor 109, or the second terminal of the transistor 110 is referred to as a node ND3. The transistor 109 controls conduction and non-conduction between the wiring 116 and the node ND3. When the transistor 109 is turned on, the wiring 116 and the node ND3 are brought into electrical contact, and the potential of the node ND3 is controlled based on the potential of the wiring 116. When the potential of the wiring 116 is VH or at a high level, the potential of the node ND3 is increased. However, since the gate of the transistor 109 is connected to the wiring 114, when the potential of the node ND3 is increased to a level obtained by subtracting the threshold voltage of the transistor 109 from the potential of the wiring 114 at a high level, the transistor 109 is turned off. Thus, the node ND3 is brought into a floating state. In this manner, the potential of the node ND3 is set to a level at which the transistor 107 or the transistor 108 is turned on, and the node ND3 is brought into a floating state. The transistor 110 controls conduction and non-conduction between the wiring 114 and the node ND3. When the transistor 110 is turned on, the wiring 114 and the node ND3 are brought into electrical contact, and the potential of the node ND3 is controlled based on the potential of the wiring 114. When the potential of the wiring 114 is at a low level, the potential of the node ND3 is decreased to VL. In this manner, the potential of the node ND3 is set to a level at which the transistor 107 or 108 is turned off. The transistors 109 and 110 preferably have the same polarity as the transistors 101 to 104.

Since the wiring 114 is set at a high level in the period T1, the transistor 109 is turned on. Since the potential of the node ND1 is set at VL, the transistor 110 is turned off. Accordingly, the potential of the wiring 116 is supplied to the node ND3, and thus the potential of the node ND3 is increased from VL. After that, when the potential of the node ND3 is higher than the sum of the potential of the first terminal of the transistor 107 (VL) and the threshold voltage of the transistor 107 (Vth107), the transistor 107 is turned on. Furthermore, when the potential of the node ND3 is higher than the sum of the potential of the first terminal of the transistor 108 (VL) and the threshold voltage of the transistor 108 (Vth108), the transistor 108 is turned on. After that, when the potential of the node ND3 is set to a level obtained by subtracting the threshold voltage of the transistor 109 (Vth109) from the potential of the gate of the transistor 109 (VH), the transistor 109 is turned off. Thus, the node ND3 is brought into a floating state, and the potential of the node ND3 is kept at VH−Vth109.

Since the potential of the wiring 114 is set at a low level in the period T2, the transistor 109 is turned off. Furthermore, when the potential of the node ND1 is higher than the sum of the potential of the first terminal of the transistor 110 (VL) and the threshold voltage of the transistor 110 (Vth110), the transistor 110 is turned on. Accordingly, the potential of the wiring 114 at a low level is supplied to the node ND3, and thus the potential of the node ND3 is decreased from VH−Vth109 to VL. Accordingly, the transistors 107 and 108 are turned off.

Since the potential of the wiring 114 is kept at a low level in the period T3, the transistor 109 is kept off. Furthermore, since the potential of the node ND1 is set at VH+Vth110+β, the transistor 110 is kept on. Accordingly, the potential of the wiring 114 at a low level is supplied to the node ND3, and thus the potential of the node ND3 is kept at VL. Accordingly, the transistors 107 and 108 are kept off.

Since the potential of the wiring 114 is set at a high level in the period T4, the transistor 109 is turned on. Since the potential of the node ND1 is set at VL, the transistor 110 is turned off. Accordingly, the potential of the wiring 116 is supplied to the node ND3, and thus the potential of the node ND3 is increased from VL. After that, when the potential of the node ND3 is higher than the sum of the potential of the first terminal of the transistor 107 (VL) and the threshold voltage of the transistor 107 (Vth107), the transistor 107 is turned on. Furthermore, when the potential of the node ND3 is higher than the sum of the potential of the first terminal of the transistor 108 (VL) and the threshold voltage of the transistor 108 (Vth108), the transistor 108 is turned on.

In FIG. 11A, the circuit 100 includes the transistors 109 and 110, whereby a signal for controlling the transistors 107 or 108 can be generated in the circuit 100. Accordingly, the number of signals can be reduced.

Figure 11B:
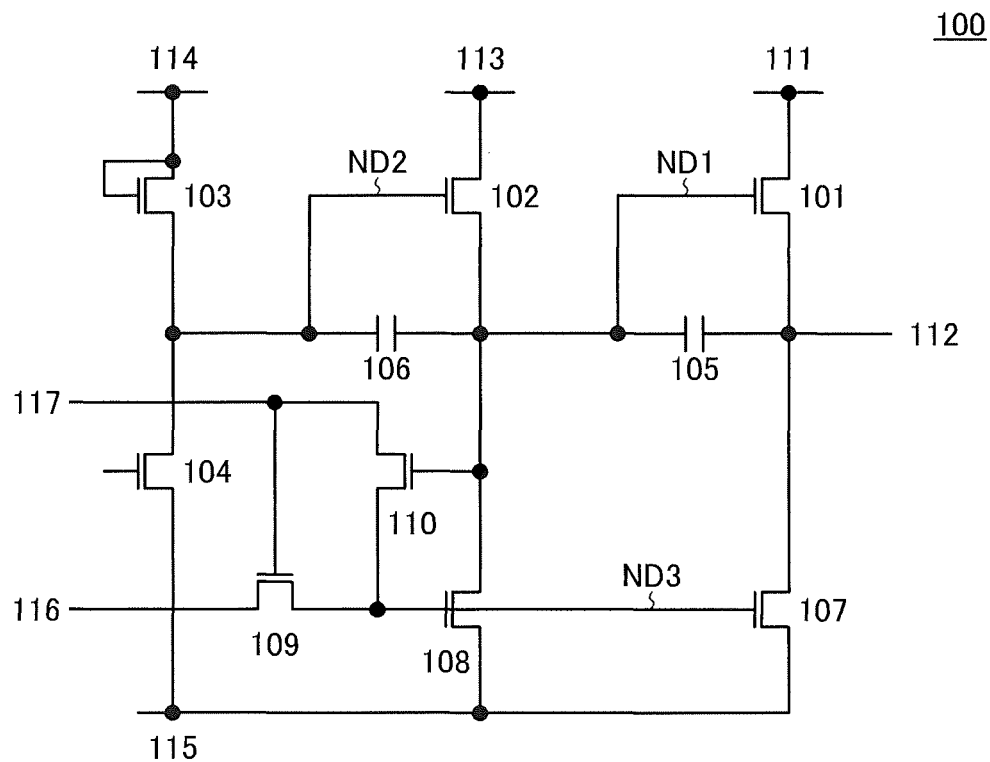

Note that as illustrated in FIG. 11B, the gate of the transistor 109 and the first terminal of the transistor 110 may be connected to a wiring 117. The potential of the wiring 117 has a high level (e.g. VH) and a low level (e.g. VL).

Note that the gate of the transistor 109 may be connected to the wiring 117, and the first terminal of the transistor 110 may be connected to the wiring 114. Alternatively, the gate of the transistor 109 may be connected to the wiring 114, and the first terminal of the transistor 110 may be connected to the wiring 117.

Note that a configuration in which the second terminals of the transistors 109 and 110 are connected to the gate of the transistor 107 and are not connected to the gate of the transistor 108 may be employed. Alternatively, a configuration in which the second terminals of the transistors 109 and 110 are connected to the gate of the transistor 108 and are not connected to the gate of the transistor 107 may be employed.

Note that the first terminal of the transistor 110 may be connected to the wirings 115, 115B, 115C, or 117.

Figure 12A:
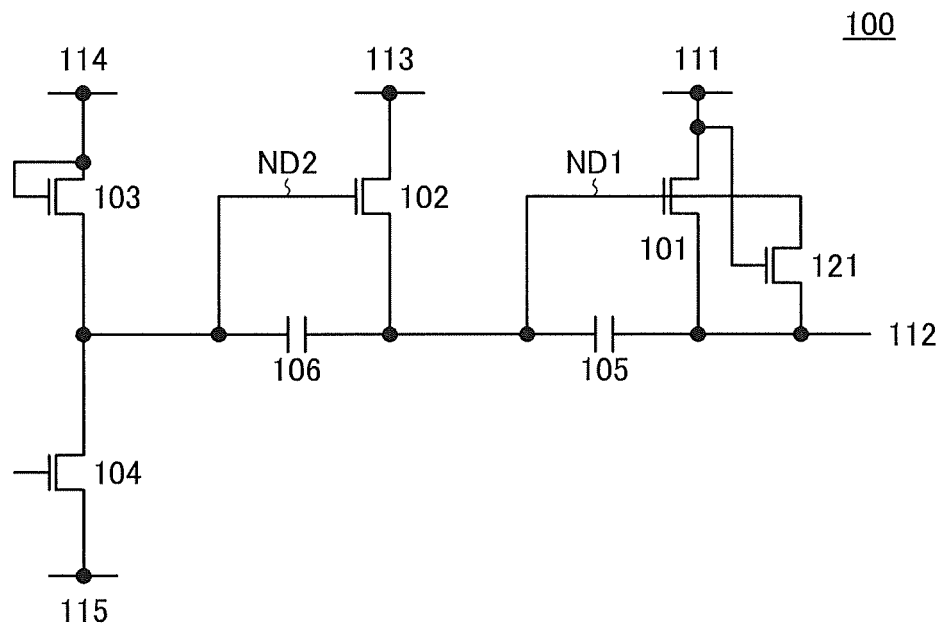
FIGS. 12A and 12B each illustrate an example of a semiconductor device.

In the circuit 100 having any of the above configurations, a transistor 121 may be additionally included. FIG. 12A illustrates a case where the transistor 121 is additionally included in the circuit 100 in FIG. 1. A first terminal, a second terminal, and a gate of the transistor 121 are connected to the wiring 112, the node ND1, and the wiring 111, respectively. The transistor 121 controls conduction and non-conduction between the wiring 112 and the node ND1. When the transistor 121 is turned on, the wiring 112 and the node ND1 are brought into electrical contact. For example, in the case where the potential of the wiring 112 is increased from VL and the potential of the node ND1 is increased from VH as in the period T3, an increase in the potential of the node ND1 is suppressed, and the time required for change in the potential of the wiring 112 is shortened. Note that since the gate of the transistor 121 is connected to the wiring 111, when the potential of the wiring 112 is set to a level obtained by subtracting the threshold voltage of the transistor 121 from the potential of the wiring 111 at a high level, the transistor 121 is turned off. The transistor 121 preferably has the same polarity as the transistors 101 to 104.

In the period T1, the wiring 111 is at a low level, and thus the transistor 121 is turned off.

In the period T2, the wiring 111 is at a low level, and thus the transistor 121 is turned off.

In the period T3, the wiring 111 is set at a high level, and thus the transistor 121 is turned on. Note that when the potential of the wiring 112 is increased to a level obtained by subtracting the threshold voltage of the transistor 121 (Vth121) from the potential of the gate of the transistor 121 (VH), the transistor 121 is turned off.

Since the wiring 111 is set at a low level in the period T4, the transistor 121 is turned off.

In FIG. 12A, the circuit 100 includes the transistor 121, whereby the potential of the node ND1 can be prevented from being too high. Thus, deterioration of the transistor connected to the node ND1 can be suppressed, and damage of the transistor can be prevented, for example.

Figure 12B:
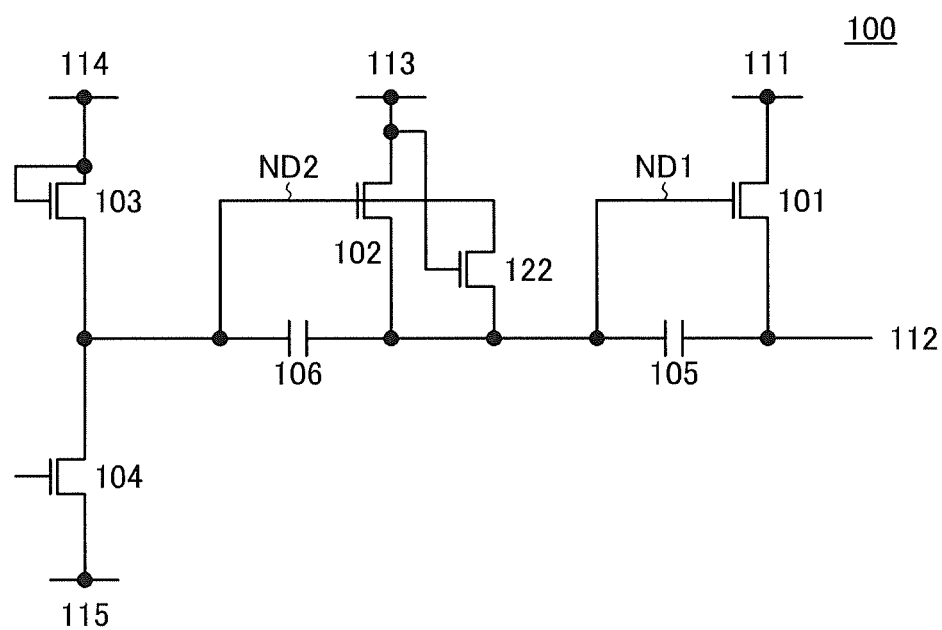

In the circuit 100 having any of the above configurations, a transistor 122 may be additionally included. FIG. 12B illustrates a case where the transistor 122 is additionally included in the circuit 100 in FIG. 1. A first terminal, a second terminal, and a gate of the transistor 122 are connected to the node ND1, the node ND2, and the wiring 113, respectively. The transistor 122 controls conduction and non-conduction between the node ND1 and the node ND2. When the transistor 122 is turned on, the node ND1 and the node ND2 are brought into electrical contact. For example, in the case where the potential of the node ND1 is increased from VL and the potential of the node ND2 is increased from VH−Vth103 as in the period T2, an increase in the potential of the node ND2 is suppressed, and the time required for change in the potential of the node ND1 is shortened. Note that since the gate of the transistor 122 is connected to the wiring 113, when the potential of the node ND1 is set to a level obtained by subtracting the threshold voltage of the transistor 122 from the potential of the wiring 113 at a high level, the transistor 122 is turned off. The transistor 122 preferably has the same polarity as the transistors 101 to 104.

Since the wiring 113 is at a low level in the period T1, the transistor 122 is turned off.

Since the wiring 113 is set at a high level in the period T2, the transistor 122 is turned on. Note that when the potential of the node ND1 is increased to a level obtained by subtracting the threshold voltage of the transistor 122 (Vth 122) from the potential of the gate of the transistor 122 (VH), the transistor 122 is turned off.

Since the wiring 113 is set at a low level in the period T3, the transistor 122 is turned off.

Since the wiring 113 is set at a low level in the period T4, the transistor 122 is turned off.

In FIG. 12B, the circuit 100 includes the transistor 122, whereby the potential of the node ND2 can be prevented from being too high. Thus, deterioration of the transistor connected to the node ND2 can be suppressed, and damage of the transistor can be prevented, for example.

Figure 13A:
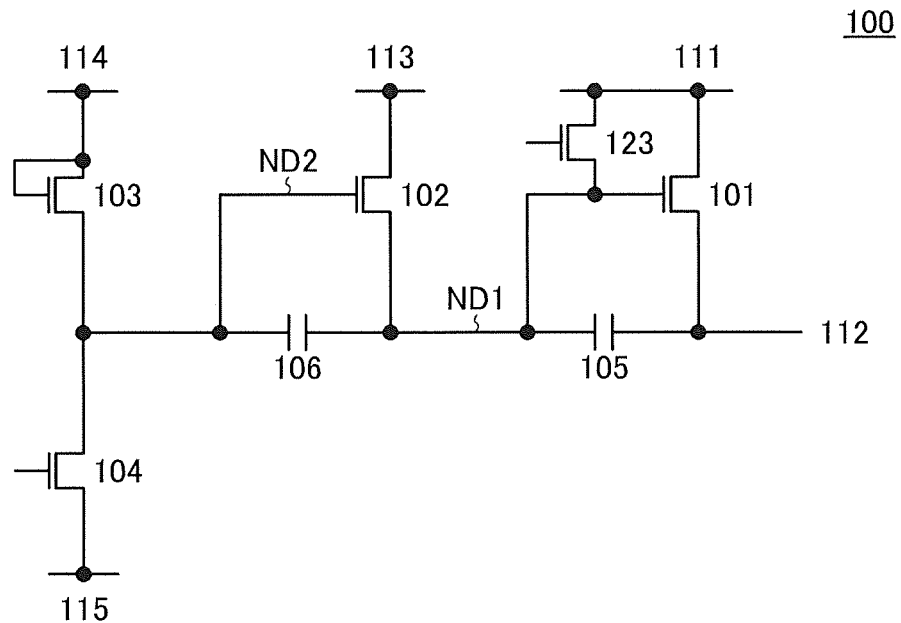
FIGS. 13A and 13B each illustrate an example of a semiconductor device.

In the circuit 100 having any of the above configurations, a transistor 123 may be additionally included. FIG. 13A illustrates a case where the transistor 123 is additionally included in the circuit 100 in FIG. 1. A first terminal and a second terminal of the transistor 123 are connected to the wiring 111 and the node ND1, respectively. The transistor 123 controls conduction and non-conduction between the wiring 111 and the node ND1. When the transistor 123 is turned on, the wiring 111 and the node ND1 are brought into electrical contact, and the potential of the wiring 111 is supplied to the node ND1. When the potential of the wiring 111 is at a low level, the potential of the node ND1 is set at VL. Thus, the potential of the node ND1 is set to a level at which the transistor 101 is turned off. The transistor 123 preferably has the same polarity as the transistors 101, 102, 103, and 104.

In the period T0, the transistor 123 is turned on. Accordingly, the potential of the wiring 111 at a low level is supplied to the node ND1, and thus the potential of the node ND1 is set at VL.

In the periods T1, T2, T3, and T4, the transistor 123 is turned off.

In FIG. 13A, the circuit 100 includes the transistor 123, whereby the potential of the node ND1 can be set at VL. Accordingly, malfunctions can be prevented.

Figure 13B:
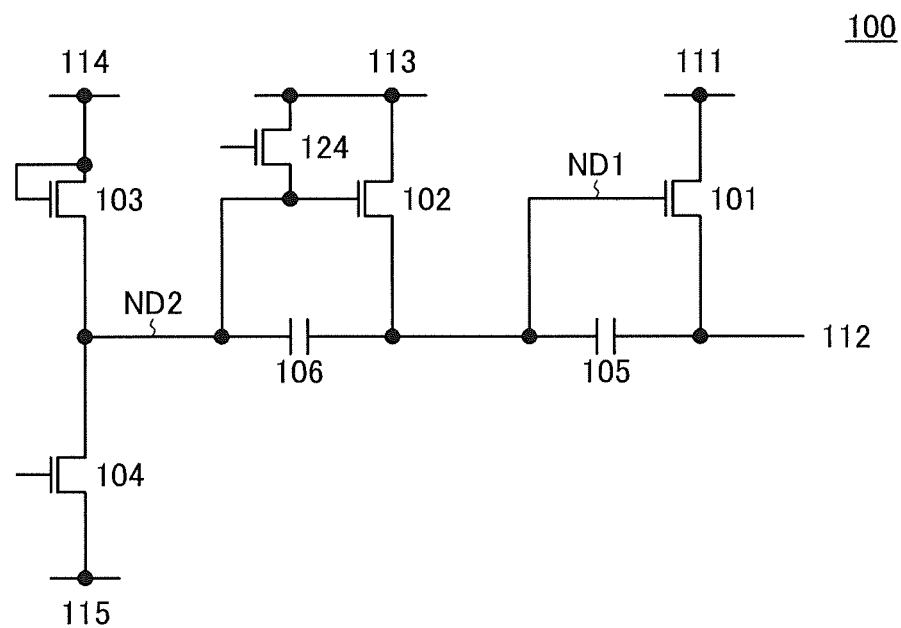

In the circuit 100 having any of the above configurations, a transistor 124 may be additionally included. FIG. 13B illustrates a case where the transistor 124 is additionally included in the circuit 100 in FIG. 1. A first terminal and a second terminal of the transistor 124 are connected to the wiring 113 and the node ND2, respectively. The transistor 124 controls conduction and non-conduction between the wiring 113 and the node ND2. When the transistor 124 is turned on, the wiring 113 and the node ND2 are brought into electrical contact, and the potential of the wiring 113 is supplied to the node ND2. When the potential of the wiring 113 is at a low level, the potential of the node ND2 is set at VL. Thus, the potential of the node ND2 is set to a level at which the transistor 102 is turned off. The transistor 124 preferably has the same polarity as the transistors 101, 102, 103, and 104.

In the period T0, the transistor 124 is turned on. Accordingly, the potential of the wiring 113 at a low level is supplied to the node ND2, and thus the potential of the node ND2 is set at VL.

In the periods T1, T2, T3, and T4, the transistor 124 is turned off.

In FIG. 13B, the circuit 100 includes the transistor 124, whereby the potential of the node ND2 can be set to VL. Accordingly, malfunctions can be prevented.

Note that in the case where both of the transistors 123 and 124 are additionally included in the circuit 100, a gate of the transistor 123 may be connected to a gate of the transistor 124.

Note that the circuit 100 described with reference to FIG. 1, FIGS. 2A and 2B, FIGS. 3A and 3B, FIGS. 4A and 4B, FIGS. 5A and 5B, FIGS. 6A and 6B, FIGS. 10A and 10B, FIGS. 11A and 11B, FIGS. 12A and 12B, FIGS. 13A and 13B, and the like; and the circuit 100 described without a drawing can be combined as appropriate.

Figure 14A:
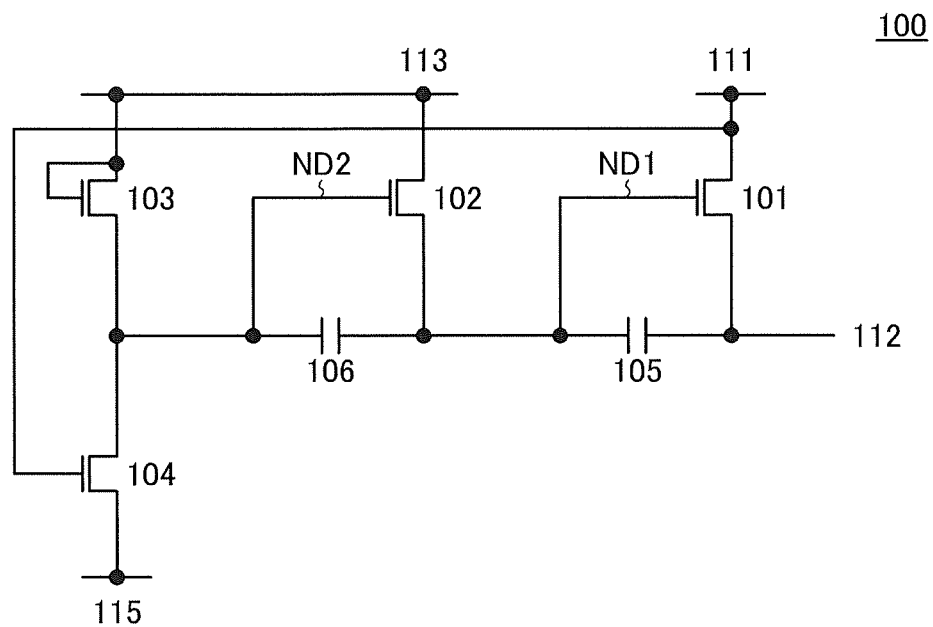
FIGS. 14A and 14B each illustrate an example of a semiconductor device.

FIG. 14A illustrates a configuration where a configuration in which the first terminal and the gate of the transistor 103 are connected to the wiring 113 (see FIG. 3A) and a configuration in which the gate of the transistor 104 is connected to the wiring 111 (see FIG. 5A) are combined.

Figure 14B:
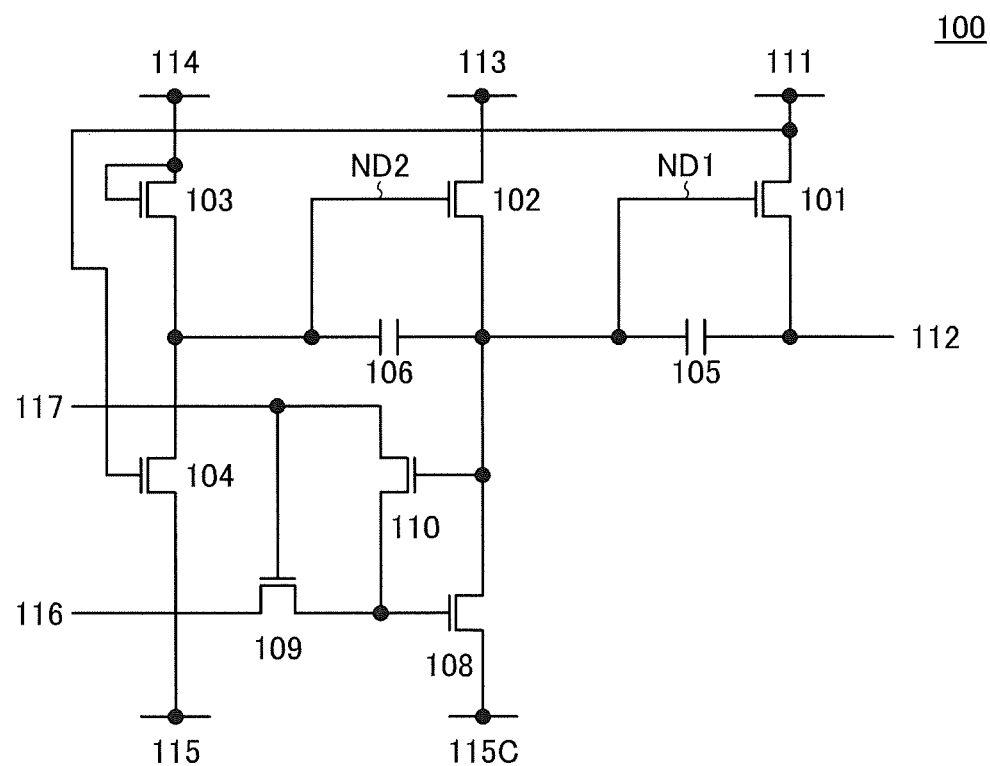

FIG. 14B illustrates a configuration where a configuration in which the gate of the transistor 104 is connected to the wiring 111 (see FIG. 5A), a configuration in which the transistor 108 is additionally included (see FIG. 10B), and a configuration in which the transistors 109 and 110 are additionally included (see FIG. 11B) are combined.

This embodiment can be combined with any of the other embodiments as appropriate. Thus, content (or may be part of the content) described in this embodiment may be applied to, combined with, or replaced by different content (or may be part of the different content) described in the embodiment and/or content (or may be part of the content) described in one or more different embodiments. Note that in each embodiment, a content described in the embodiment is a content described with reference to a variety of diagrams or a content described with a text described in this specification. In addition, by combining a diagram (or part thereof) described in one embodiment with another part of the diagram, a different diagram (or part thereof) described in the same embodiment, and/or a diagram (or part thereof) described in another or other embodiments, much more diagrams can be formed. This applies also to other embodiments.

Embodiment 2

In this embodiment, a semiconductor device of one embodiment of the present invention is described.

A structure of a semiconductor device of one embodiment of the present invention is described with reference to FIG. 15. Note that one embodiment of the present invention is not limited to the structure described below.

Figure 15:
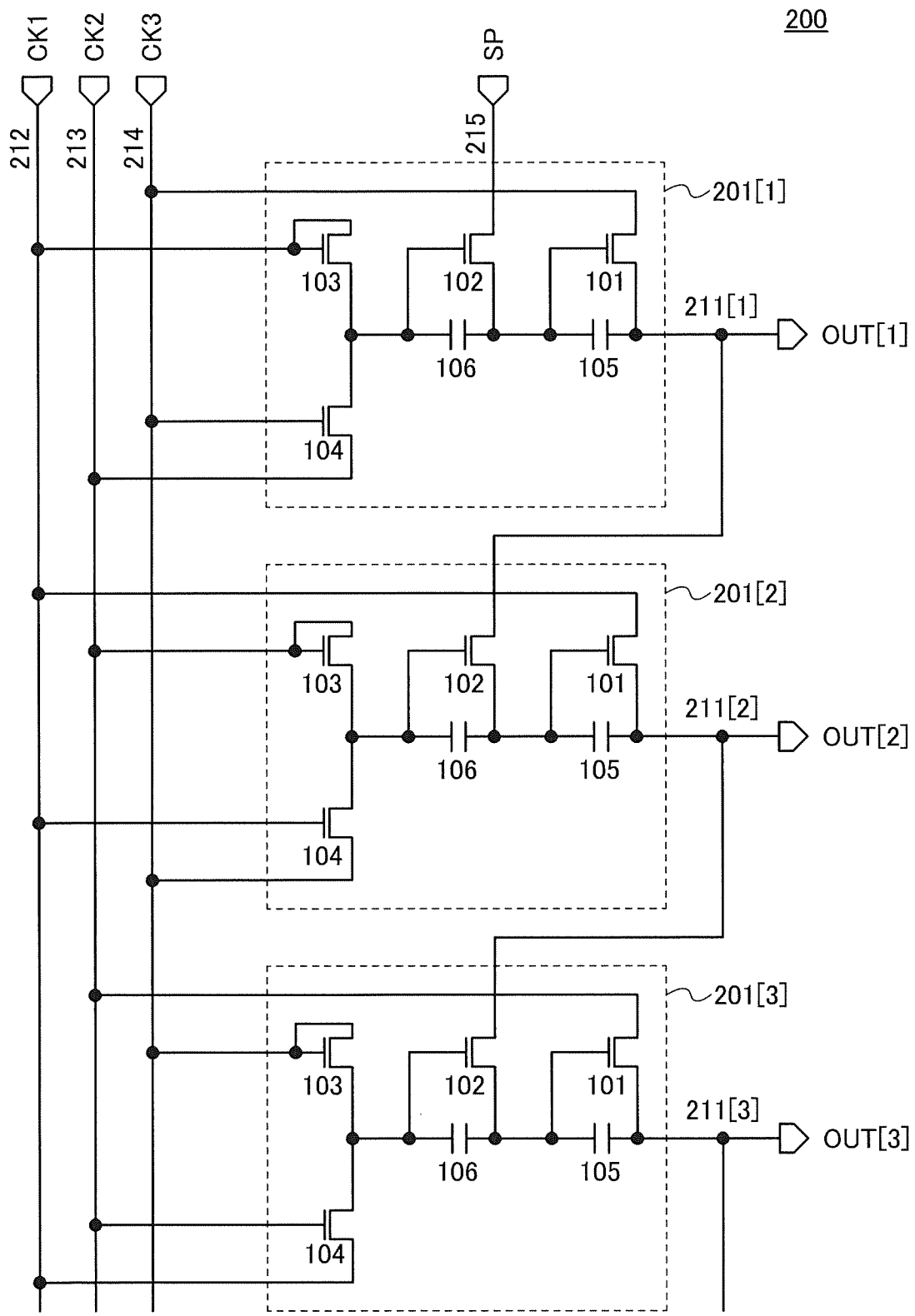
FIG. 15 illustrates an example of a semiconductor device.

A semiconductor device illustrated in FIG. 15 includes a circuit 200. The circuit 200 has a function of controlling potentials of N (N is a natural number of 3 or more) wirings 211 (also referred to as wirings 211[1] to [N]) based on potentials of a wirings 212, 213, 214, and 215. The circuit 200 outputs signals based on the potentials of the wirings 212, 213, 214, and 215 to the corresponding wirings 211[1] to [N]. The potentials of the wirings 211[1] to [N] are controlled with the signals.

Figure 16:
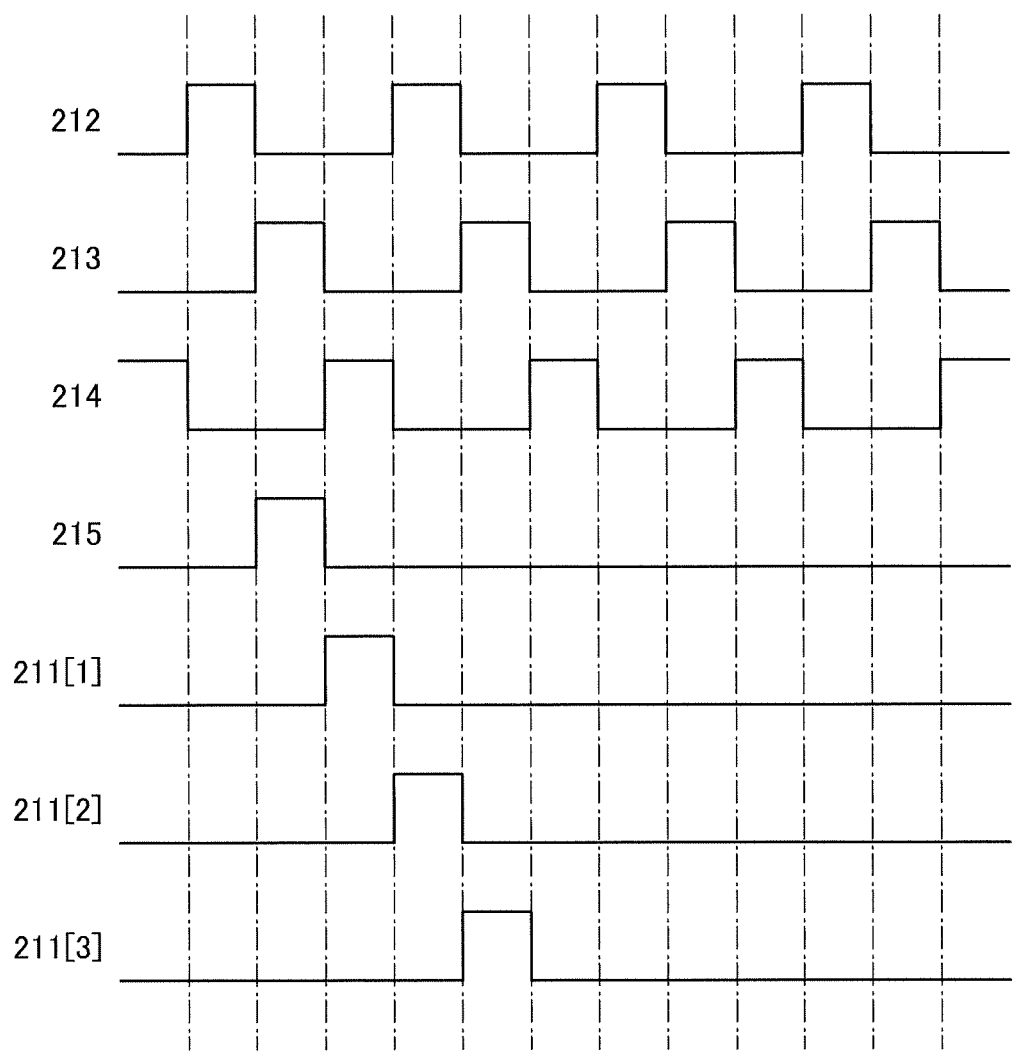
FIG. 16 is a timing chart showing an example of operation of a semiconductor device.

Specifically, based on the potentials of the wirings 212, 213, 214, and 215, the circuit 200 has a function of sequentially making the potentials of the wirings 211[1] to [N] active, that is, a function of sequentially setting the potentials of the wirings 211[1] to [N] at a high level or a low level. FIG. 16 is a timing chart in the case of sequentially setting the potentials of the wirings 211[1] to [N] at a high level based on the potentials of the wirings 212, 213, 214, and 215. As described above, the circuit 200 has a function of a shift register.

Note that the potentials of the wirings 212, 213, 214, and 215 are controlled by signals, voltage, or the like being input to the corresponding wirings. For example, a signal CK1 is input to the wiring 212, a signal CK2 is input to the wiring 213, a signal CK3 is input to the wiring 214, a signal SP is input to the wiring 215, and signals OUT[1] to [N] are output to the wirings 211[1] to [N]. That is, the signals OUT[1] to [N] each have a value based on the signals CK1, CK2, and CK3, and the signal SP. As the signals CK1, CK2, and CK3, clock signals whose phases are different are used. As the signal SP, a start pulse is used.

The circuit 200 includes N circuits 201 (also referred to as circuits 201[1] to [N]). Each of the circuits 201[1] to [N] corresponds to the circuit 100 described in Embodiment 1. In FIG. 15, the circuit 100 illustrated in FIG. 5A is used as each of the circuits 201[1] to [N].

In the circuit 201[2m+1] (m is 0 or a positive integer), the first terminal of the transistor 101 and the gate of the transistor 104 are connected to the wiring 214. Accordingly, the wiring 214 corresponds to the wiring 111. The second terminal of the transistor 101 is connected to the wiring 211[2m+1]. Accordingly, the wiring 211[2m+1] corresponds to the wiring 112. The first terminal of the transistor 102 is connected to the wiring 215 or the wiring 211[2m]. Accordingly, the wiring 215 or the wiring 211[2m] corresponds to the wiring 113. The first terminal and the gate of the transistor 103 are connected to the wiring 212. Accordingly, the wiring 212 corresponds to the wiring 114. The first terminal of the transistor 104 is connected to the wiring 213. Accordingly, the wiring 213 corresponds to the wiring 115.

In the circuit 201[2m+2], the first terminal of the transistor 101 and the gate of the transistor 104 are connected to the wiring 212. Accordingly, the wiring 212 corresponds to the wiring 111. The second terminal of the transistor 101 is connected to the wiring 211[2m+2]. Accordingly, the wiring 211[2m+2] corresponds to the wiring 112. The first terminal of the transistor 102 is connected to the wiring 211[2m+1]. Accordingly, the wiring 211[2m+1] corresponds to the wiring 113. The first terminal and the gate of the transistor 103 are connected to the wiring 213. Accordingly, the wiring 213 corresponds to the wiring 114. The first terminal of the transistor 104 is connected to the wiring 214. Accordingly, the wiring 214 corresponds to the wiring 115.

In the circuit 201[2m+3], the first terminal of the transistor 101 and the gate of the transistor 104 are connected to the wiring 213. Accordingly, the wiring 213 corresponds to the wiring 111. The second terminal of the transistor 101 is connected to the wiring 211[2m+3]. Accordingly, the wiring 211[2m+3] corresponds to the wiring 112. The first terminal of the transistor 102 is connected to the wiring 211[2m+2]. Accordingly, the wiring 211[2m+2] corresponds to the wiring 113. The first terminal and the gate of the transistor 103 are connected to the wiring 214. Accordingly, the wiring 214 corresponds to the wiring 114. The first terminal of the transistor 104 is connected to the wiring 212. Accordingly, the wiring 212 corresponds to the wiring 115.

Figure 17:
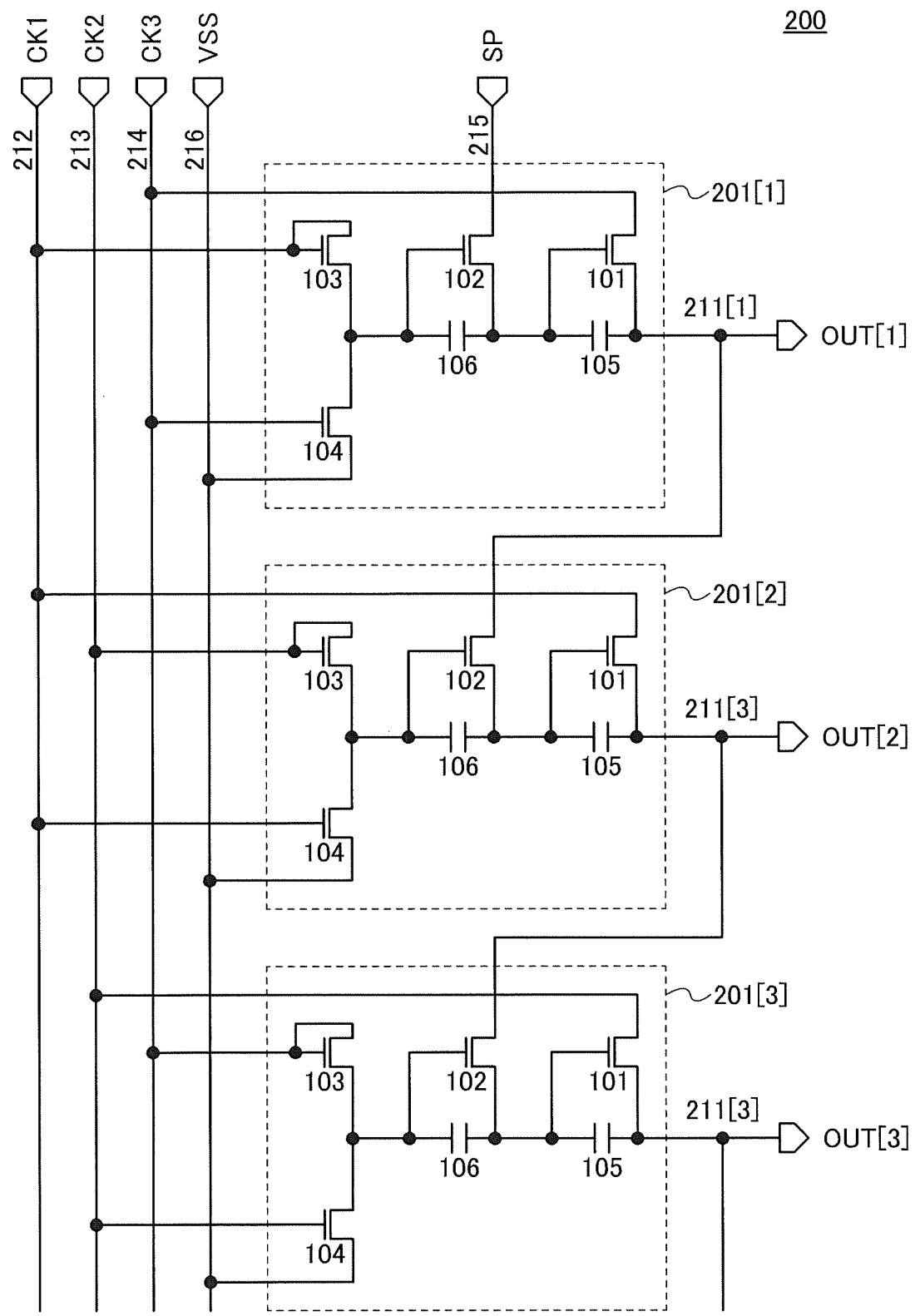
FIG. 17 illustrates an example of a structure of a semiconductor device.

Note that as illustrated in FIG. 17, in each of the circuits 201[1] to [N], the first terminal of the transistor 104 may be connected to a wiring 216. The wiring 216 corresponds to the wiring 115. The wiring 216 may be supplied with a voltage VSS. The voltage VSS has a value which corresponds to (which is the same or substantially the same as) low levels of the signals CK1, CK2, and CK3, and the signal SP.

Figure 18:
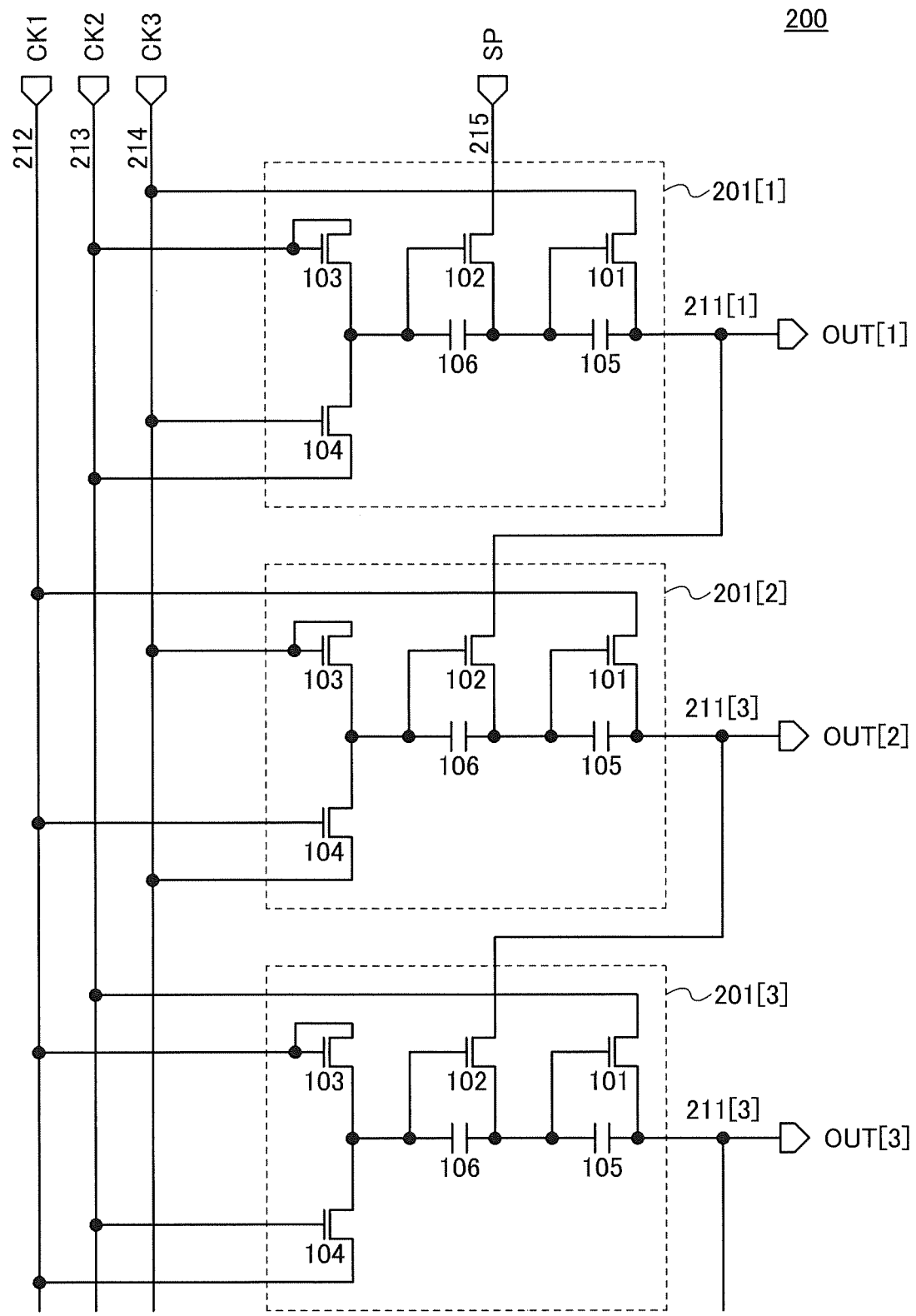
FIG. 18 illustrates an example of a semiconductor device.

Note that as illustrated in FIG. 18, in the circuit 201[2m+1], the first terminal and the gate of the transistor 103 may be connected to the wiring 213. In the circuit 201[2m+2], the first terminal and the gate of the transistor 103 may be connected to the wiring 214. In the circuit 201[2m+3], the first terminal and the gate of the transistor 103 may be connected to the wiring 212. That is, in the circuit 201[i] (i is any of 2 to N), the first terminal and the gate of the transistor 103 may be connected to any of the wirings 212, 213, and 214 to which the first terminal of the transistor 101 in the circuit 201[i−1] is connected.

Note that in the case of employing the circuit 100 in which the first terminal or the gate of the transistor 103 is connected to the wiring 116 in each of the circuits 201[1] to [N] (see FIG. 2A, 2B, and FIG. 3B, for example), a wiring to which the first terminal or the gate of the transistor 103 in the circuits 201[1] to [N] is connected may be additionally provided.

This embodiment can be combined with any of the other embodiments as appropriate. Thus, content (or may be part of the content) described in this embodiment may be applied to, combined with, or replaced by different content (or may be part of the different content) described in the embodiment and/or content (or may be part of the content) described in one or more different embodiments. Note that in each embodiment, a content described in the embodiment is a content described with reference to a variety of diagrams or a content described with a text described in this specification. In addition, by combining a diagram (or part thereof) described in one embodiment with another part of the diagram, a different diagram (or part thereof) described in the same embodiment, and/or a diagram (or part thereof) described in another or other embodiments, much more diagrams can be fainted. This applies also to other embodiments.

Embodiment 3

In this embodiment, a display device of one embodiment of the present invention is described.

A structure of a display device of one embodiment of the present invention is described with reference to FIG. 19. Note that one embodiment of the present invention is not limited to the structure described below.

Figure 19:
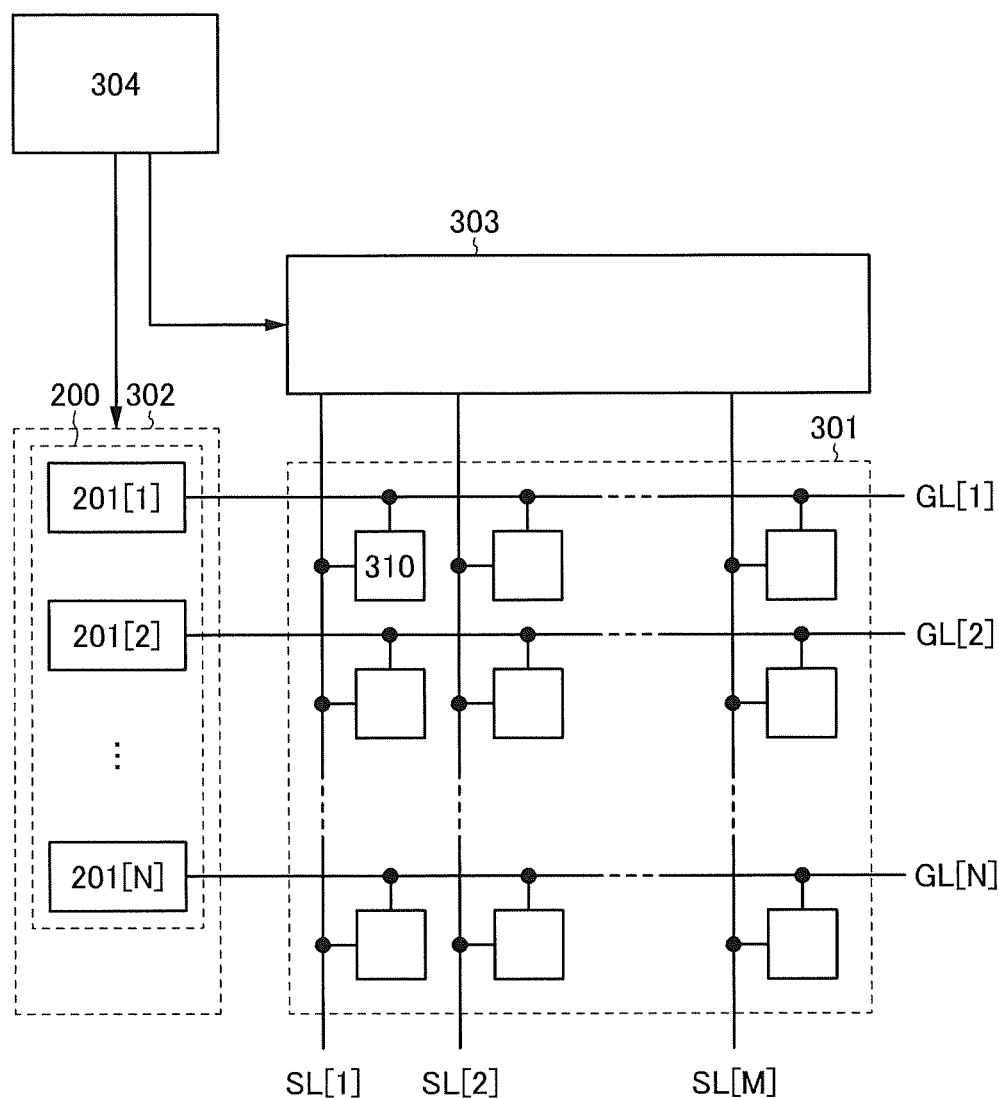
FIG. 19 illustrates an example of a display device.

A display device illustrated in FIG. 19 includes a pixel portion 301, a scan line driver circuit 302, and a signal line driver circuit 303.

In the pixel portion 301, N scan lines GL (also referred to as scan lines GL [1] to [N]) and M (M is a natural number of two or more) signal lines SL (also referred to as signal lines SL [1] to [M]) are provided so as to intersect with each other. A pixel 310 is provided at each intersection.

The pixel 310 includes at least a display element and a transistor. Examples of a display element include a light-emitting element and a liquid crystal element. An example of a light-emitting element includes an EL element.

For example, in this specification and the like, a display element, a display device which is a device including a display element, a light-emitting element, and a light-emitting device which is a device including a light-emitting element can employ a variety of modes or can include a variety of elements. A display element, a display device, a light-emitting element, or a light-emitting device includes, for example, at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Other than the above, a display medium whose contrast, luminance, reflectance, transmittance, or the like is changed by electrical or magnetic action may be included. Note that examples of display devices having EL elements include an EL display. Display devices having electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an MN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

The scan line driver circuit 302 has a function of controlling potentials of the scan lines GL [1] to [N]. The scan line driver circuit 302 outputs a scan signal to each of the scan lines GL[1] to [N]. Each of the potentials of the scan lines GL[1] to [N] is controlled by the scan signal. The scan line driver circuit 302 can include the circuit 100 described in Embodiment 1 or the circuit 200 described in Embodiment 2. In such a case, each of the scan lines GL[1] to [N] corresponds to the wiring 112, for example. Alternatively, the scan lines GL[1] to [N] correspond to the wiring 211[1] to [N]. Signals which control the scan line driver circuit 302 (a clock signal, a start pulse, and the like, or the signals CK1, CK2, and CK3, and the signal SP, and the like) are supplied from the circuit 304.

The signal line driver circuit 303 has a function of controlling the potentials or the current of the signal lines SL[1] to [M]. The signal line driver circuit 303 outputs a video signal to each of the signal lines SL[1] to [M]. Each of the potentials of the signal lines SL[1] to [M] is controlled with the video signal. The signal line driver circuit 303 can include the circuit 100 described in Embodiment 1 or the circuit 200 described in Embodiment 2. Signals which control the signal line driver circuit 303 (e.g., a clock signal, a start pulse, a video signal, and the like) are supplied from the circuit 304.

Note that the circuit 304 serves as a timing controller for supplying signals to the scan line driver circuit 302 and the signal line driver circuit 303. The circuit 304 may apply a voltage to the scan line driver circuit 302 and the signal line driver circuit 303. In such a case, the circuit 304 serves as a power supply circuit.

Note that the scan line driver circuit 302 is operated at a lower speed than the signal line driver circuit 303. Accordingly, a transistor included in the scan line driver circuit 302 preferably includes an oxide semiconductor, a polycrystalline silicon, or an amorphous silicon in a channel formation region. A transistor included in the signal line driver circuit 303 preferably includes single crystal silicon in a channel formation region. Accordingly, it is preferable that the pixel portion 301 and the scan line driver circuit 302 be provided over the same substrate and the signal line driver circuit 303 be provided over another substrate. Note that the pixel portion 301, the scan line driver circuit 302, and the signal line driver circuit 303 may be provided over the same substrate.

Note that the circuit 100 described in Embodiment 1 or the circuit 200 described in Embodiment 2 is used in the scan line driver circuit 302, whereby all the transistors included in the scan line driver circuit 302 can have the same polarity. Accordingly, in the case where the pixel portion 301 and the scan line driver circuit 302 are provided over the same substrate, all the transistors provided over the substrate preferably have the same polarity.

Note that the circuit 100 described in Embodiment 1 or the circuit 200 described in Embodiment 2 is used in the scan line driver circuit 302, whereby a layout area of the scan line driver circuit 302 can be reduced. Accordingly, the resolution of the pixel 310 can be improved. Furthermore, the frame can be reduced.

This embodiment can be combined with any of the other embodiments as appropriate. Thus, content (or may be part of the content) described in this embodiment may be applied to, combined with, or replaced by different content (or may be part of the different content) described in the embodiment and/or content (or may be part of the content) described in one or more different embodiments. Note that in each embodiment, a content described in the embodiment is a content described with reference to a variety of diagrams or a content described with a text described in this specification. In addition, by combining a diagram (or part thereof) described in one embodiment with another part of the diagram, a different diagram (or part thereof) described in the same embodiment, and/or a diagram (or part thereof) described in another or other embodiments, much more diagrams can be formed. This applies also to other embodiments.

Embodiment 4

In this embodiment, a structure of the semiconductor device described in Embodiment 1 is described.

Figure 20:
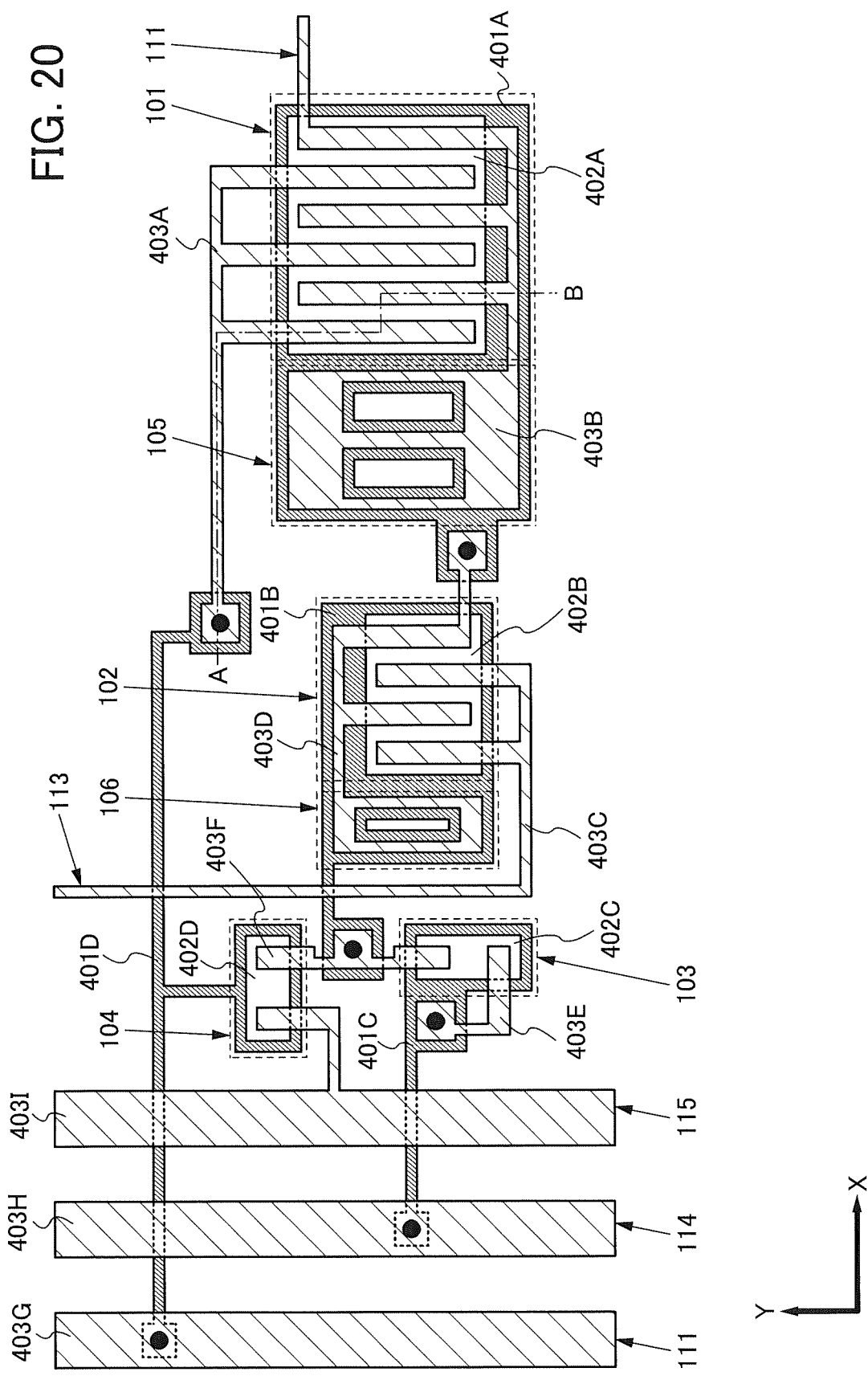
FIG. 20 illustrates an example of a semiconductor device.
Figure 23:
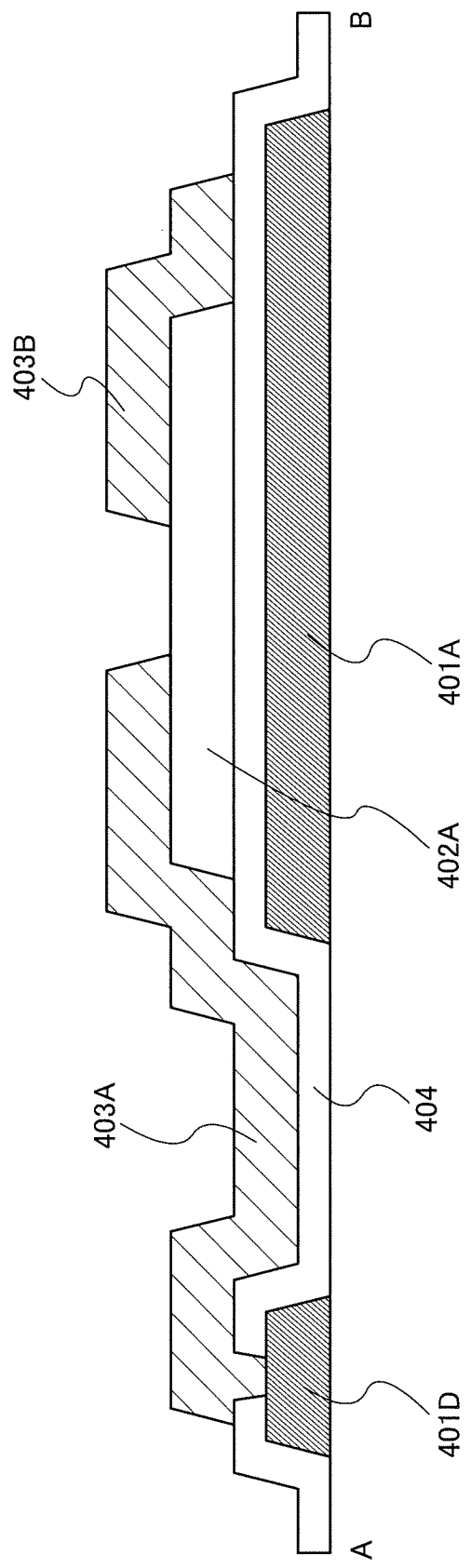
FIG. 23 illustrates an example of a semiconductor device.

FIG. 20 is a top view of the semiconductor device illustrated in FIG. 5A. FIG. 23 is a cross-sectional view taken along line A-B of the top view of FIG. 20. Note that one embodiment of the present invention is not limited to the structure described below.

Figure 21:
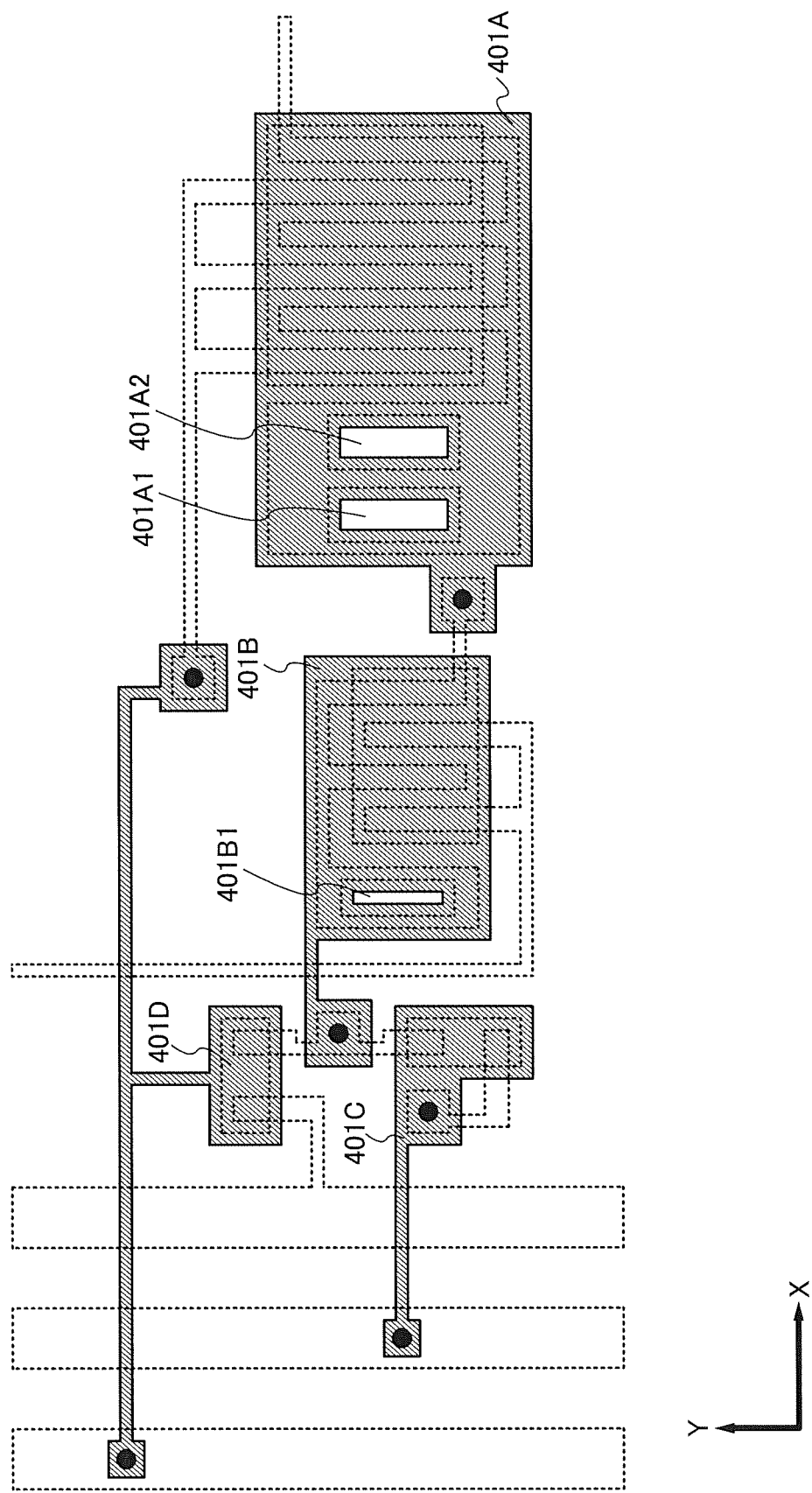
FIG. 21 illustrates an example of a semiconductor device.
Figure 22:
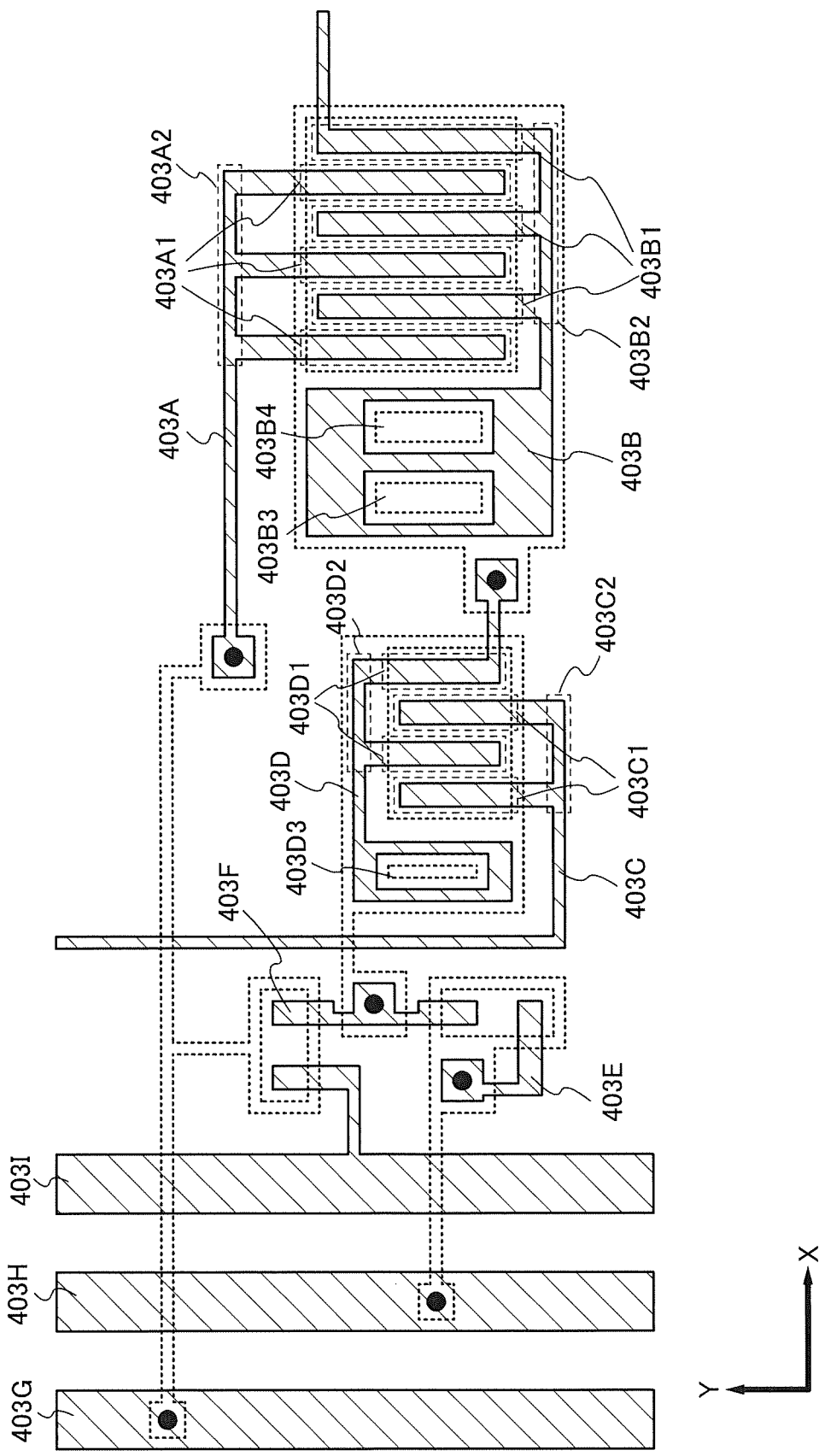
FIG. 22 illustrates an example of a semiconductor device.

The semiconductor device illustrated in FIG. 20 includes conductive layers 401A to 401D, semiconductor layers 402A to 402D, conductive layers 403A to 403I, and an insulating layer 404. FIG. 21 illustrates only the conductive layers 401A to 401D. FIG. 22 illustrates only the conductive layers 403A to 403I. Note that the X direction is substantially perpendicular to the Y direction. Alternatively, the X direction is a direction intersecting with the Y direction.

The insulating layer 404 includes a region serving as a gate insulating layer of the transistor 101, a region serving as a gate insulating layer of the transistor 102, a region serving as a gate insulating layer of the transistor 103, and a region serving as a gate insulating layer of the transistor 104. Furthermore, the insulating layer 404 includes a region interposed between the conductive layer 401A and the semiconductor layer 402A, a region interposed between the conductive layer 401B and the semiconductor layer 402B, a region interposed between the conductive layer 401C and the semiconductor layer 402C, and a region interposed between the conductive layer 401D and the semiconductor layer 402D. Note that black circles in the figures indicate contact holes in the insulating layer 404.

As the insulating layer 404, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The conductive layers 401A to 401D are in the same layer. Alternatively, the conductive layers 401A to 401D include the same material. Further alternatively, the conductive layers 401A to 401D are formed through a step of processing the same conductive film.

The conductive layers 401A to 401D can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these elements; or the like.

In addition, the conductive layers 401A to 401D may have a single-layer structure or a layered structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

Alternatively, the conductive layers 401A to 401D can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductive layers 401A to 401D. Use of a Cu—X alloy film enables the manufacturing cost to be reduced because wet etching process can be used in the processing.

The conductive layer 401A includes a region serving as a gate electrode of the transistor 101 and a region serving as a second electrode of the capacitor 105. The conductive layer 401A also includes an opening 401A1 and an opening 401A2. Each of the opening 401A1 and the opening 401A2 is long along substantially the Y direction.

The conductive layer 401B includes a region serving as a gate electrode of the transistor 102 and a region serving as a second electrode of the capacitor 106. The conductive layer 401B also includes an opening 401B1. The opening 401B1 is long along substantially the Y direction.

The conductive layer 401C includes a region serving as a gate electrode of the transistor 103.

The conductive layer 401D includes a region serving as a gate electrode of the transistor 104.

Note that the area of the conductive layer 401A is larger than each of the areas of the conductive layers 401B, 401C, and 401D. Furthermore, the area of the conductive layer 401B is larger than each of the areas of the conductive layers 401C and 401D.

Note that each of the areas of the openings 401A1 and 401A2 is larger than the area of the opening 401B1. Each of the widths of the openings 401A1 and 401A2 is larger than the width of the opening 401B1. Each of the lengths in a long length direction of the openings 401A1 and 401A2 is larger than the length in the long length direction of the opening 401B1.

Note that three or more openings may be provided in the conductive layer 401A, and two or more openings may be provided in the conductive layer 401B. Note that the number of openings included in the conductive layer 401A is preferably larger than that in the conductive layer 401B.

The semiconductor layers 402A to 402D are in the same layer. Alternatively, the semiconductor layers 402A to 402D include the same material. Further alternatively, the semiconductor layers 402A to 402D are formed through a step of processing the same semiconductor film.

For the semiconductor layers 402A to 402D, a single crystal semiconductor or a non-single-crystal semiconductor can be used. Examples of a non-single-crystal semiconductor include non-single-crystal silicon and non-single-crystal germanium. Examples of non-single-crystal silicon include amorphous silicon, microcrystalline silicon, and polycrystalline silicon. Examples of non-single-crystal germanium include amorphous germanium, microcrystalline germanium, and polycrystalline germanium.

It is particularly preferable that an oxide semiconductor film be processed to form the semiconductor layers 402A to 402D. For an oxide semiconductor film, an In-M oxide (M is Ti, Ga, Sn, Y, Zr, La, Ce, Nd, or Hf) or an In-M-Zn oxide can be used. It is particularly preferable to use In-M-Zn oxide for the oxide semiconductor film. In the case where the oxide semiconductor film is an In-M-Zn oxide, it is preferable that the atomic ratio of metal elements of a sputtering target used for forming a film of the In-M-Zn oxide satisfy In$\geq$M and Zn$\geq$M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. When the oxide semiconductor film is an In-M-Zn oxide, a target including polycrystalline In-M-Zn oxide is preferably used as a sputtering target. With the use of the target including polycrystalline In-M-Zn oxide, an oxide semiconductor film having crystallinity can be easily formed. Note that the atomic ratio of metal elements in the oxide semiconductor film varies from the atomic ratio of those in the above-described sputtering target, within a range of ±40% as an error. For example, when a sputtering target with an atomic ratio of In to Ga and Zn of 4:2:4.1 is used, the atomic ratio of In to Ga and Zn in the oxide semiconductor film may be 4:2:3 or in the vicinity of 4:2:3.

The energy gap of the oxide semiconductor film is 2 eV or more, preferably 2.5 eV or more, further preferably 3 eV or more. In this manner, the amount of off-state current of a transistor can be reduced by using an oxide semiconductor having a wide energy gap.

The thickness of the oxide semiconductor film is greater than or equal to 3 nm and less than or equal to 200 nm, preferably greater than or equal to 3 nm and less than or equal to 100 nm, further preferably greater than or equal to 3 nm and less than or equal to 50 nm.

An oxide semiconductor film with low carrier density is used as the oxide semiconductor film. For example, the carrier density of the oxide semiconductor film is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$. The carrier density of the oxide semiconductor film may be preferably greater than or equal to $1\times10^{5}/cm^3$, further preferably greater than or equal to $1\times10^{7}/cm^3$.

Note that without limitation to the materials given above, a material with an appropriate composition depending on intended semiconductor characteristics and electrical characteristics (e.g., field-effect mobility and threshold voltage) of a transistor can be used. In order to obtain intended semiconductor characteristics of the transistor, it is preferable to set appropriate carrier density, impurity concentration, defect density, atomic ratio of a metal element to oxygen, interatomic distance, density, and the like of the oxide semiconductor film.

Note that it is preferable to use, as the oxide semiconductor film, an oxide semiconductor film in which the impurity concentration is low and density of defect states is low, in which case the transistors can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small variation in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen contained in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal element causes generation of an electron serving as a carrier. Thus, a transistor including an oxide semiconductor film which contains hydrogen is likely to be normally on. Accordingly, it is preferable that hydrogen be reduced as much as possible in the oxide semiconductor film. Specifically, in the oxide semiconductor film, the concentration of hydrogen which is measured by secondary mass spectrometry (SIMS) may be lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, or further preferably lower than or equal to $1\times10^{16}$ atoms/cm$^3$. Furthermore, in the oxide semiconductor film, the concentration of hydrogen which is measured by secondary mass spectrometry (SIMS) may be higher than or equal to $1\times10^{16}$ atoms/cm$^3$, preferably higher than or equal to $1\times10^{17}$ atoms/cm$^3$.

When silicon or carbon that is one of elements belonging to Group 14 is contained in the oxide semiconductor film, oxygen vacancy is increased in the oxide semiconductor film, and the oxide semiconductor film becomes an n-type film. Thus, the concentration of silicon or carbon (the concentration is measured by SIMS) in the oxide semiconductor film or the concentration of silicon or carbon (the concentration is measured by SIMS) in the vicinity of an interface with the oxide semiconductor film is set to be lower than or equal to $2\times10^{18}$ atoms/cm$^3$. The concentration of silicon or carbon (the concentration is measured by SIMS) in the oxide semiconductor film or the concentration of silicon or carbon (the concentration is measured by SIMS) at or near an interface with the oxide semiconductor film may be preferably set to be higher than or equal to $1\times10^{17}$ atoms/cm$^3$, further preferably higher than or equal to $3\times10^{17}$ atoms/cm$^3$, still further preferably higher than or equal to $1\times10^{18}$ atoms/cm$^3$.

In addition, the concentration of alkali metal or alkaline earth metal of the oxide semiconductor film, which is measured by SIMS, is lower than or equal to $1\times10^{18}$ atoms/cm$^3$, or preferably lower than or equal to $2\times10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal of the oxide semiconductor film. In addition, the concentration of alkali metal or alkaline earth metal of the oxide semiconductor film, which is measured by SIMS, may be higher than or equal to $5\times10^{15}$ atoms/cm$^3$, or preferably higher than or equal to $1\times10^{16}$ atoms/cm$^3$.

Further, when nitrogen is contained in the oxide semiconductor film, electrons serving as carriers are generated and the carrier density increases, so that the oxide semiconductor film easily becomes n-type. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$. Furthermore, the concentration of nitrogen which is measured by SIMS may be higher than or equal to $1\times10^{16}$ atoms/cm$^3$, preferably higher than or equal to $5\times10^{16}$ atoms/cm$^3$, further preferably higher than or equal to $1\times10^{17}$ atoms/cm$^3$, still further preferably higher than or equal to $5\times10^{17}$ atoms/cm$^3$.

The oxide semiconductor film may have a non-single-crystal structure. The non-single crystal structure includes a c-axis aligned crystalline oxide semiconductor (CAAC-OS) which is described later, a polycrystalline structure, a microcrystalline structure, or an amorphous structure, for example. Among the non-single crystal structure, the amorphous structure has the highest density of defect levels, whereas CAAC-OS has the lowest density of defect levels.

A structure of the oxide semiconductor film is described below.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and microcrystalline oxide semiconductor.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancy in the oxide semiconductor film serves as a carrier trap or serves as a carrier generation source when hydrogen is captured therein.

The state in which impurity concentration is low and density of defect states is low (the amount of oxygen vacancy is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed.

In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, in the case of the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

The semiconductor layer 402A has a channel formation region of the transistor 101.

The semiconductor layer 402B has a channel formation region of the transistor 102.

The semiconductor layer 402C has a channel formation region of the transistor 103.

The semiconductor layer 402D has a channel formation region of the transistor 104.

Note that the area of the semiconductor layer 402A is larger than each of the areas of the semiconductor layers 402B, 402C, and 402D. The area of the semiconductor layer 402B is larger than each of the areas of the semiconductor layers 402C and 402D.

Note that the semiconductor layer 402A is provided on an inner side than an edge portion of the conductive layer 401A. The semiconductor layer 402B is provided on an inner side than an edge portion of the conductive layer 401B. The semiconductor layer 402C is provided on an inner side than an edge portion of the conductive layer 401C. The semiconductor layer 402D is provided on an inner side than an edge portion of the conductive layer 401D. Thus, steps of the semiconductor layers 402A to 402D are not formed, which can suppress generation of defects.

The conductive layers 403A to 403I are in the same layer. Alternatively, the conductive layers 403A to 403I include the same material. Further alternatively, the conductive layers 403A to 403I are formed through a step of processing the same conductive film.

A material or a structure for the conductive layers 403A to 403I can be selected from materials or structures which can be used for the conductive layers 401A to 401D as appropriate.

The conductive layer 403A includes a region serving as one of a source electrode or a drain electrode of the transistor 101. The conductive layer 403A is connected to the semiconductor layer 402A. Alternatively, the conductive layer 403A includes a region in contact with the semiconductor layer 402A. The conductive layer 403A is connected to the conductive layer 401D through a contact hole in the insulating layer 404. Alternatively, the conductive layer 403A includes a region in contact with the conductive layer 401D. The conductive layer 403A includes a plurality of regions 403A1. Each of the plurality of regions 403A1 is long along substantially the Y direction and overlaps with the conductive layer 401A with the semiconductor layer 402A interposed therebetween. Furthermore, the conductive layer 403A includes a region 403A2. The region 403A2 is long along substantially the X direction and does not overlap with the conductive layer 401A and the semiconductor layer 402A.

The conductive layer 403B includes a region serving as the other of the source electrode and the drain electrode of the transistor 101, a region serving as a first electrode of the capacitor 105, and a region serving as the wiring 113. The conductive layer 403B is connected to the semiconductor layer 402A. Alternatively, the conductive layer 403B includes a region in contact with the semiconductor layer 402A. Furthermore, the conductive layer 403B includes a plurality of regions 403B1. Each of the plurality of regions 403B1 is long along substantially the Y direction and overlaps with the conductive layer 401A with the semiconductor layer 402A interposed therebetween. Furthermore, the conductive layer 403B includes a region 403B2. The region 403B2 is long along substantially the X direction and overlaps with the conductive layer 401A without the semiconductor layer 402A interposed therebetween. The conductive layer 403B includes an opening 403B3 and an opening 403B4. Each of the openings 403B3 and 403B4 is long along substantially the Y direction.

The conductive layer 403C includes a region serving as one of a source electrode and a drain electrode of the transistor 102 and a region serving as the wiring 113. The conductive layer 403C is connected to the semiconductor layer 402B. Alternatively, the conductive layer 403C includes a region in contact with the semiconductor layer 402B. Furthermore, the conductive layer 403C includes a plurality of regions 403C1. Each of the plurality of regions 403C1 is long along substantially the Y direction and overlaps with the conductive layer 401B with the semiconductor layer 402B interposed therebetween. In addition, the conductive layer 403C includes a region 403C2. The region 403C2 is long along substantially the X direction and does not overlap with the semiconductor layer 402B and the conductive layer 401B.

The conductive layer 403D includes a region serving as the other of the source electrode and the drain electrode of the transistor 102 and a region serving as a first electrode of the capacitor 106. The conductive layer 403D is connected to the semiconductor layer 402B. Alternatively, the conductive layer 403D includes a region in contact with the semiconductor layer 402B. The conductive layer 403D is connected to the conductive layer 401A through the contact hole in the insulating layer 404. Alternatively, the conductive layer 403D includes a region in contact with the conductive layer 401A. Furthermore, the conductive layer 403D includes a plurality of regions 403D1. Each of the plurality of regions 403D1 is long along substantially the Y direction and overlaps with the conductive layer 401B with the semiconductor layer 402B interposed therebetween. Furthermore, the conductive layer 403D includes a region 403D2. The region 403D2 is long along substantially the X direction and overlaps with the conductive layer 401B without the semiconductor layer 402B interposed therebetween. In addition, the conductive layer 403D includes an opening 403D3. The opening 403D3 is long along substantially the Y direction.

The conductive layer 403E includes a region serving as one of a source electrode and a drain electrode of the transistor 103. The conductive layer 403E is connected to the semiconductor layer 402C. Alternatively, the conductive layer 403E includes a region in contact with the semiconductor layer 402C. Furthermore, the conductive layer 403 is connected to the conductive layer 401C through the contact hole in the insulating layer 404. Alternatively, the conductive layer 403E includes a region in contact with the conductive layer 401C.

The conductive layer 403F includes a region serving as the other of the source electrode and the drain electrode of the transistor 103 and a region serving as one of a source electrode and a drain electrode of the transistor 104. The conductive layer 403F is connected to the semiconductor layer 402C and the semiconductor layer 402D. In other words, the conductive layer 403F includes a region in contact with the semiconductor layer 402C and a region in contact with the semiconductor layer 402D. Furthermore, the conductive layer 403F is connected to the conductive layer 401B through the contact hole in the insulating layer 404. In other words, the conductive layer 403F includes a region in contact with the conductive layer 401B.

The conductive layer 403G includes a region serving as the wiring 111. Furthermore, the conductive layer 403G is connected to the conductive layer 401D through the contact hole in the insulating layer 404. In other words, the conductive layer 403G includes a region in contact with the conductive layer 401D.

The conductive layer 403H includes a region serving as the wiring 114. Furthermore, the conductive layer 403H is connected to the conductive layer 401C through the contact hole in the insulating layer 404. In other words, the conductive layer 403H includes a region in contact with the conductive layer 401C.

The conductive layer 403I includes a region serving as the wiring 115 and a region serving as the other of the source electrode and the drain electrode of the transistor 104. Furthermore, the conductive layer 403I is connected to the semiconductor layer 402D. In other words, the conductive layer 403I includes a region in contact with the semiconductor layer 402D.

Note that the area of the opening 403B3 is larger than that of the opening 401A1, and the area of the opening 403B4 is larger than that of the opening 401A2. The opening 401A1 is provided on an inner side than the opening 403B3, and the opening 401A2 is provided on an inner side than the opening 403B4. Thus, a step of the conductive layer 403B due to the conductive layer 401A is not formed, which can suppress generation of defects.

Note that the area of the opening 403D3 is larger than that of the opening 401B1. The opening 404A1 is provided on an inner side than the opening 403D3. Thus, a step of the conductive layer 403D due to the conductive layer 401B is not formed, which can suppress generation of defects.

Note that the region 403A2 of the conductive layer 403A does not overlap with the conductive layer 401A and the semiconductor layer 402A, whereas the region 403B2 of the conductive layer 403B overlaps with the conductive layer 401A without the semiconductor layer 402A interposed therebetween. Note that the region 403B2 of the conductive layer 403B may overlap with the conductive layer 401A with the semiconductor layer 402A interposed therebetween. The area where the conductive layers 403A and 401A overlap with each other is smaller than the area where the conductive layers 403B and 401A overlap with each other. Thus, the parasitic capacitance between the conductive layers 403A and 401A can be reduced, and the parasitic capacitance between the conductive layers 403B and 401A can be increased. Accordingly, an influence of the potential of the wiring 111 on the gate of the transistor 101 can be reduced, and the capacitance of the capacitor 105 can be small, which enables a reduction in a layout area.

Note that the region 403C2 of the conductive layer 403C does not overlap with the conductive layer 401B and the semiconductor layer 402B, whereas the region 403D2 of the conductive layer 403D overlaps with the conductive layer 401B without the semiconductor layer 402B interposed therebetween. Note that the region 403D2 of the conductive layer 403D may overlap with the conductive layer 401B with the semiconductor layer 402B interposed therebetween. The area where the conductive layers 403C and 401B overlap with each other is smaller than the area where the conductive layers 403D and 401B overlap with each other. Thus, the parasitic capacitance between the conductive layers 403C and 401B can be reduced, and the parasitic capacitance between the conductive layers 403D and 401B can be increased. Accordingly, an influence of the potential of the wiring 113 on the gate of the transistor 102 can be reduced, and the capacitance of the capacitor 106 can be small, which enables a reduction in a layout area.

There is no particular limitation on the property of a material and the like of a substrate where the conductive layers 401A to 401D, the semiconductor layers 402A to 402D, the conductive layers 403A to 403I, and the insulating layer 404 are formed as long as the material has heat resistance enough to withstand at least heat treatment to be performed later. For example, a glass substrate, a ceramic substrate, a quartz substrate, a sapphire substrate, or the like may be used as the substrate. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate. Furthermore, any of these substrates further provided with a semiconductor element may be used as the substrate. In the case where a glass substrate is used as the substrate, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is completed, separated from the substrate, and transferred to another substrate. In such a case, the transistor can be transferred to a substrate having low heat resistance or a flexible substrate as well.

Note that in this specification and the like, a transistor can be formed using any of a variety of substrates, for example. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, polyvinyl chloride, or the like. Other examples are polyester, polyamide, polyimide, aramid, epoxy, an inorganic vapor deposition film, paper, and the like. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is completed, separated from the substrate, and transferred to another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above substrate over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

This embodiment can be combined with any of the other embodiments as appropriate. Thus, content (or may be part of the content) described in this embodiment may be applied to, combined with, or replaced by different content (or may be part of the different content) described in the embodiment and/or content (or may be part of the content) described in one or more different embodiments. Note that in each embodiment, a content described in the embodiment is a content described with reference to a variety of diagrams or a content described with a text described in this specification. In addition, by combining a diagram (or part thereof) described in one embodiment with another part of the diagram, a different diagram (or part thereof) described in the same embodiment, and/or a diagram (or part thereof) described in another or other embodiments, much more diagrams can be formed. This applies also to other embodiments.

Embodiment 5

In this embodiment, a display module and electronic appliances that include a semiconductor device of one embodiment of the present invention are described with reference to FIG. 24 and FIGS. 25A to 25G.

Figure 24:
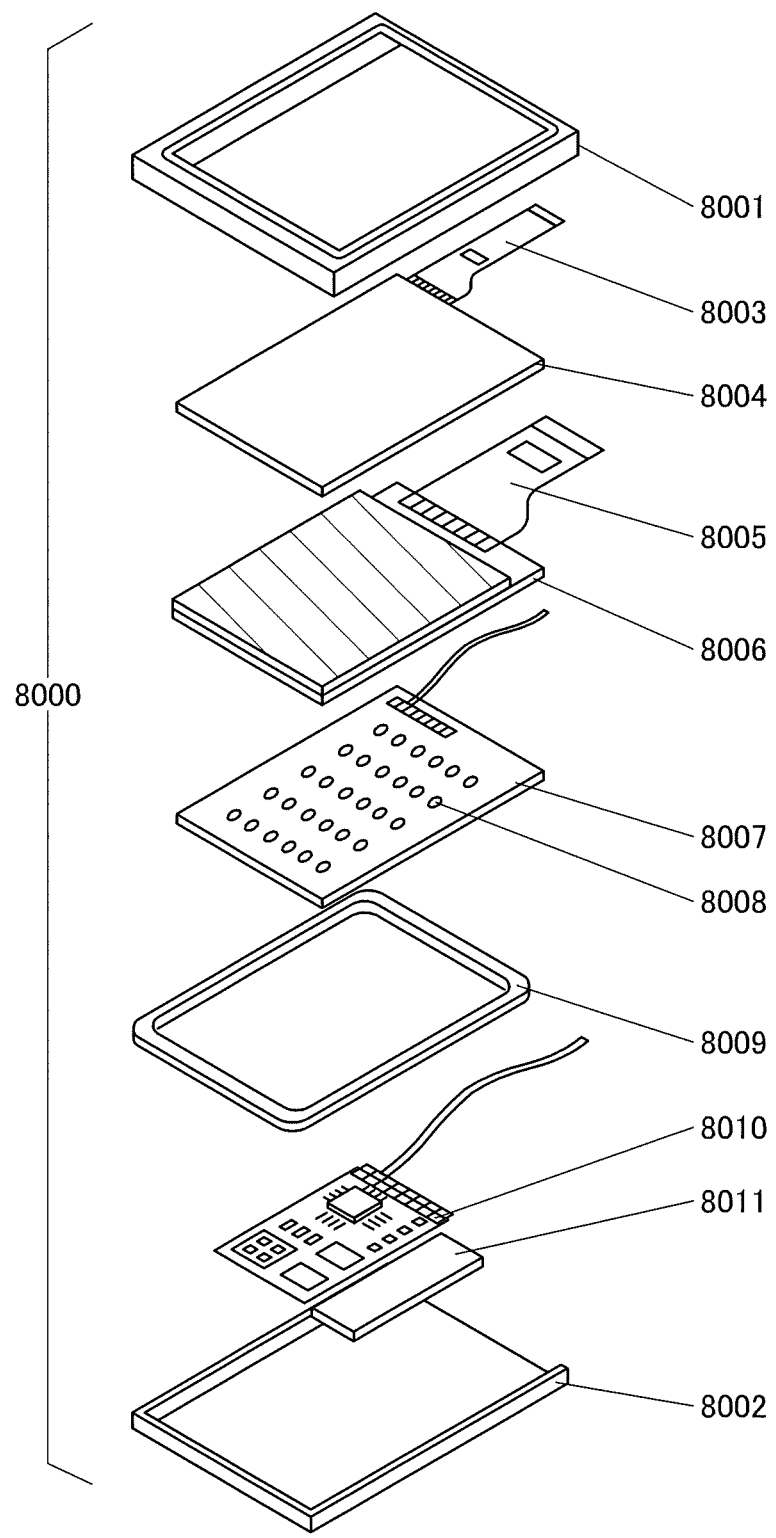
FIG. 24 illustrates an example of a display module.

In a display module 8000 illustrated in FIG. 24, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device or the display device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 so that the touch panel 8004 can function as an optical touch panel.

The backlight 8007 includes a light source 8008. Note that although a structure in which the light sources 8008 are provided over the backlight 8007 is illustrated in FIG. 24, one embodiment of the present invention is not limited to this structure. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and functions as an electromagnetic shield for blocking electromagnetic waves generated by the operation of the printed board 8010. The frame 8009 can function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 25A to 25G illustrate electronic appliances. These electronic appliances can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic appliances illustrated in FIGS. 25A to 25G can have a variety of functions. The electronic appliances illustrated in FIGS. 25A to 25G can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic appliances illustrated in FIGS. 25A to 25G are not limited to those described above, and the electronic appliances can have a variety of functions. Although not illustrated in FIGS. 25A to 25G, the electronic appliance may include a plurality of display portions. Furthermore, the electronic appliance may be provided with a camera and the like and have a function of shooting a still image, a function of shooting a moving image, a function of storing a shot image in a memory medium (an external memory medium or a memory medium incorporated in the camera), a function of displaying a shot image on the display portion, or the like.

The electronic appliances illustrated in FIGS. 25A to 25G are described in detail below.

Figure 25A:
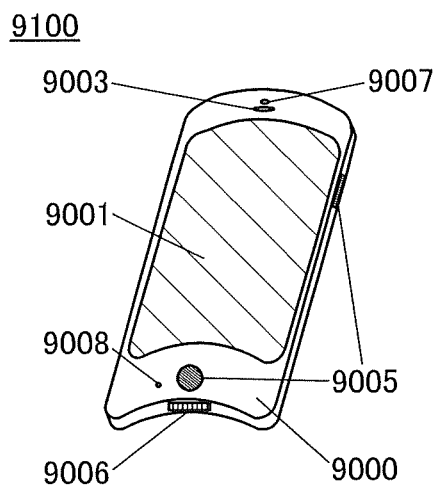
FIGS. 25A to 25G illustrate examples of an electronic appliance.

FIG. 25A is a perspective view illustrating a portable information terminal 9100. A display portion 9001 of the portable information terminal 9100 is flexible. Therefore, the display portion 9001 can be incorporated along a bent surface of a bent housing 9000. Furthermore, the display portion 9001 includes a touch sensor, and operation can be performed by touching the screen with a finger, a stylus, or the like. For example, by touching an icon displayed on the display portion 9001, application can be started.

Figure 25D:
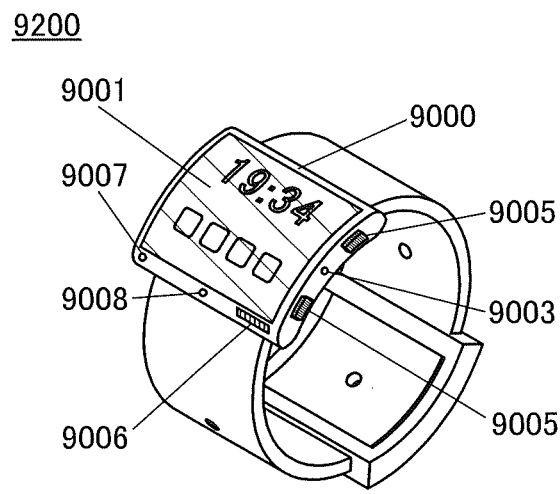
Figure 25B:
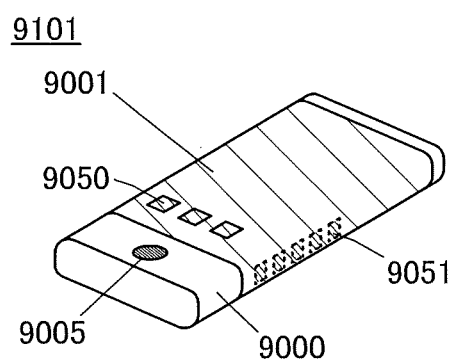

FIG. 25B is a perspective view illustrating a portable information terminal 9101. The portable information terminal 9101 function as, for example, one or more of a telephone set, a notebook, and an information browsing system. Specifically, the portable information terminal 9101 can be used as a smartphone. Note that although the speaker 9003, the connection terminal 9006, the sensor 9007, and the like of the portable information terminal 9101 are not illustrated in FIG. 25B, they can be provided in the same positions as the portable information terminal 9100 in FIG. 25A. The portable information terminal 9101 can display characters and image information on its plurality of surfaces. For example, three operation buttons 9050 (also referred to as operation icons or simply icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, and call; the title and sender of an email and SNS massage; the date; the time; remaining battery; and the reception strength of an antenna. Alternatively, the operation buttons 9050 or the like may be displayed in place of the information 9051.

Figure 25E:
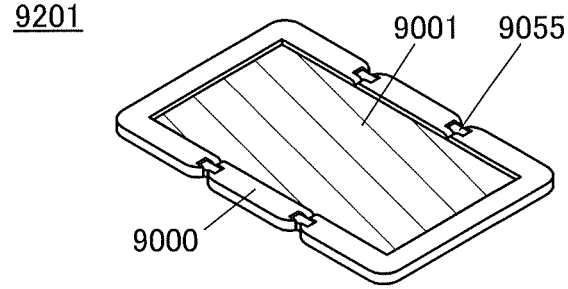
Figure 25C:
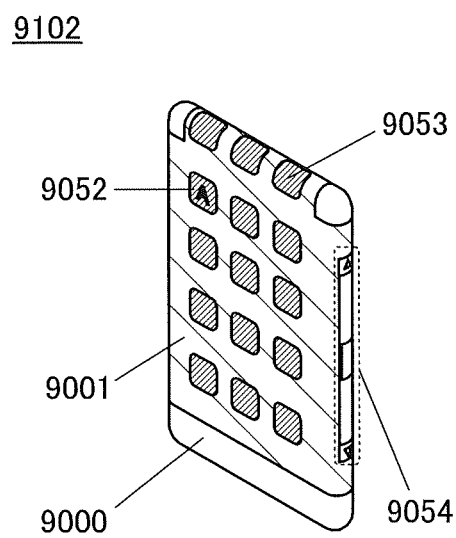

FIG. 25C is a perspective view illustrating a portable information terminal 9102. The portable information terminal 9102 has a function of displaying information, for example, on three or more sides of the display portion 9001. Here, information 9052, information 9053, and information 9054 are displayed on different sides. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 25D is a perspective view illustrating a wrist-watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. Moreover, the portable information terminal 9200 includes the connection terminal 9006, and data can be directly transmitted to and received from another information terminal via a connector. Charging through the connection terminal 9006 is possible. Note that the charging operation may be performed by wireless power feeding without using the connection terminal 9006.

Figure 25F:
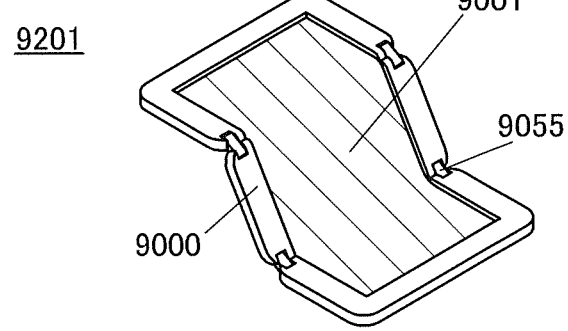
Figure 25G:
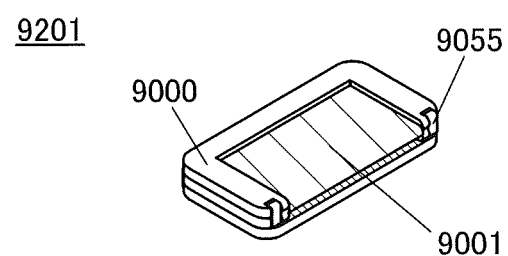

FIGS. 25E, 25F, and 25G are perspective views illustrating a foldable portable information terminal 9201. FIG. 25E is a perspective view illustrating the portable information terminal 9201 that is opened, FIG. 25F is a perspective view illustrating the portable information terminal 9201 that is being opened or being folded, and FIG. 25G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

Electronic appliances described in this embodiment are characterized by having a display portion for displaying some sort of information. Note that the semiconductor device of one embodiment of the present invention can also be used for an electronic appliance that does not have a display portion. The structure in which the display portion of the electronic appliance described in this embodiment is flexible and display can be performed on the bent display surface or the structure in which the display portion of the electronic appliance is foldable is described as an example; however, the structure is not limited thereto and a structure in which the display portion of the electronic appliance is not flexible and display is performed on a plane portion may be employed.

The structure described in this embodiment can be used in appropriate combination with the structure described in any of the other embodiments.

This application is based on Japanese Patent Application serial no. 2014-150532 filed with Japan Patent Office on Jul. 24, 2014, the entire contents of which are hereby incorporated by reference.

What is claimed is:
1. A semiconductor device comprising:
a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor and a fifteenth transistor, each having a same polarity,
wherein one of a source and a drain of the first transistor is electrically connected to a first wiring,
wherein the other of the source and the drain of the first transistor is electrically connected to a gate of the second transistor, wherein one of a source and a drain of the second transistor is electrically connected to a second wiring,
wherein the other of the source and the drain of the second transistor is electrically connected to a gate of the third transistor,
wherein one of a source and a drain of the third transistor is electrically connected to a third wiring,
wherein the other of the source and the drain of the third transistor is electrically connected to a fourth wiring,
wherein one of a source and a drain of the fourth transistor is electrically connected to the third wiring,
wherein the other of the source and the drain of the fourth transistor is electrically connected to a gate of the fifth transistor,
wherein one of a source and a drain of the fifth transistor is electrically connected to the fourth wiring,
wherein the other of the source and the drain of the fifth transistor is electrically connected to a gate of the sixth transistor,
wherein one of a source and a drain of the sixth transistor is electrically connected to a fifth wiring,
wherein the other of the source and the drain of the sixth transistor is electrically connected to a sixth wiring,
wherein one of a source and a drain of the seventh transistor is electrically connected to the fifth wiring,
wherein the other of the source and the drain of the seventh transistor is electrically connected to a gate of the eighth transistor,
wherein one of a source and a drain of the eighth transistor is electrically connected to the sixth wiring,
wherein the other of the source and the drain of the eighth transistor is electrically connected to a gate of the ninth transistor,
wherein one of a source and a drain of the ninth transistor is electrically connected to the first wiring,
wherein the other of the source and the drain of the ninth transistor is electrically connected to a seventh wiring,
wherein one of a source and a drain of the tenth transistor is electrically connected to an eighth wiring,
wherein the other of the source and the drain of the tenth transistor is electrically connected to the other of the source and the drain of the third transistor,
wherein one of a source and a drain of the eleventh transistor is electrically connected to the eighth wiring,
wherein the other of the source and the drain of the eleventh transistor is electrically connected to the gate of the third transistor,
wherein a gate of the eleventh transistor is electrically connected to a gate of the tenth transistor,
wherein one of a source and a drain of the twelfth transistor is electrically connected to the eighth wiring,
wherein the other of the source and the drain of the twelfth transistor is electrically connected to the other of the source and the drain of the sixth transistor,
wherein one of a source and a drain of the thirteenth transistor is electrically connected to the eighth wiring,
wherein the other of the source and the drain of the thirteenth transistor is electrically connected to the gate of the sixth transistor,
wherein a gate of the thirteenth transistor is electrically connected to a gate of the twelfth transistor,
wherein one of a source and a drain of the fourteenth transistor is electrically connected to the eighth wiring,
wherein the other of the source and the drain of the fourteenth transistor is electrically connected to the other of the source and the drain of the ninth transistor,
wherein one of a source and a drain of the fifteenth transistor is electrically connected to the eighth wiring,
wherein the other of the source and the drain of the fifteenth transistor is electrically connected to the gate of the ninth transistor, and
wherein a gate of the fifteenth transistor is electrically connected to a gate of the fourteenth transistor.

2. The semiconductor device according to claim 1, wherein the semiconductor device is one of a smartphone and a wrist-watch.

* * * * *